(12) United States Patent
Shetty et al.

(10) Patent No.: US 12,336,319 B2
(45) Date of Patent: Jun. 17, 2025

(54) GERMANIUM SINGLE-CRYSTAL WAFER, METHOD FOR PREPARING GERMANIUM SINGLE-CRYSTAL WAFER, METHOD FOR PREPARING CRYSTAL BAR, AND USE OF SINGLE-CRYSTAL WAFER

(71) Applicant: BEIJING TONGMEI XTAL TECHNOLOGY CO., LTD., Beijing (CN)

(72) Inventors: Rajaram Shetty, Fremont, CA (US); Yuanli Wang, Beijing (CN); Weiguo Liu, Fremont, CA (US); Yvonne Zhou, Fremont, CA (US); Sung-Nee George Chu, Fremont, CA (US)

(73) Assignee: BEIJING TONGMEI XTAL TECHNOLOGY CO., LTD., Beijing (CN)

( * ) Notice: Subject to any disclaimer, the term of this patent is extended or adjusted under 35 U.S.C. 154(b) by 753 days.

(21) Appl. No.: 17/615,484

(22) PCT Filed: May 15, 2020

(86) PCT No.: PCT/CN2020/090402
§ 371 (c)(1),
(2) Date: Nov. 30, 2021

(87) PCT Pub. No.: WO2020/238646
PCT Pub. Date: Dec. 3, 2020

(65) Prior Publication Data
US 2022/0238746 A1 Jul. 28, 2022

(30) Foreign Application Priority Data
May 31, 2019 (CN) .......................... 201910483748.4

(51) Int. Cl.
*H10F 71/00* (2025.01)
*C30B 29/06* (2006.01)
(Continued)

(52) U.S. Cl.
CPC ......... *H10F 71/1212* (2025.01); *C30B 29/06* (2013.01); *C30B 29/08* (2013.01); *H10D 62/10* (2025.01); *H10F 10/174* (2025.01)

(58) Field of Classification Search
CPC ... H01L 31/1808; H01L 29/06; H01L 31/077; H01L 31/0687; H01L 29/16; C30B 29/06;
(Continued)

(56) References Cited

U.S. PATENT DOCUMENTS 5,958,370 A  9/1999  Zones et al.

FOREIGN PATENT DOCUMENTS

CN  1649092 A  8/2005
CN  102400219 A  4/2012
(Continued)

OTHER PUBLICATIONS

Machine translation of CN-108588816-A (Year: 2018).*
(Continued)

*Primary Examiner* — Sally A Merkling
*Assistant Examiner* — Logan Edward Laclair
(74) *Attorney, Agent, or Firm* — Clements Bernard Walker; Christopher L. Bernard

(57) ABSTRACT

A germanium single-crystal wafer comprises silicon with an atomic concentration of from $3\times10^{14}$ atoms/cc to $10\times10^{18}$ atoms/cc, boron with an atomic concentration of from $1\times10^{16}$ atoms/cc to $10\times10^{18}$ atoms/cc, and gallium with an atomic concentration of from $1\times10^{16}$ atoms/cc to $10\times10^{19}$ atoms/cc. Further provided are a method for preparing the germanium single-crystal wafer, a method for preparing a germanium single-crystal ingot, and the use of the germa-
(Continued)

nium single-crystal wafer for increasing the open-circuit voltage of a solar cell. The germanium single-crystal wafer has an improved electrical property in that it has a smaller difference in resistivity and carrier concentration.

20 Claims, 7 Drawing Sheets

(51) Int. Cl.
*C30B 29/08* (2006.01)
*H10D 62/10* (2025.01)
*H10F 10/174* (2025.01)

(58) Field of Classification Search
CPC ....... C30B 29/08; C30B 11/002; C30B 11/02; C30B 33/00; B24B 1/00; B24B 9/065; B28D 5/00
See application file for complete search history.

(56) References Cited

FOREIGN PATENT DOCUMENTS

| | | | | |
|---|---|---|---|---|
| CN | 102877121 | A | | 1/2013 |
| CN | 105063750 | A | | 11/2015 |
| CN | 108091708 | A | * | 5/2018 ............. C30B 11/00 |
| CN | 108588816 | A | * | 9/2018 |
| CN | 110202419 | A | | 9/2019 |
| JP | 2000026957 | A | * | 1/2000 |
| WO | 2008028522 | A1 | | 3/2008 |

OTHER PUBLICATIONS

Machine translation of CN-108091708-A (Year: 2018).*
Machine translation of JP2000026957A (Year: 2000).*
Aug. 21, 2020, International Search Report for International Patent Application No. PCT/CN2020/090402.
Supplemental International Search Report for International Patent Application No. PCT/CN2020/090402.

* cited by examiner

Semi-enclosure graphite designed as two halves, to facilitate separation of the wafers in a subsequent step Semi-enclosure graphite

GERMANIUM SINGLE-CRYSTAL WAFER, METHOD FOR PREPARING GERMANIUM SINGLE-CRYSTAL WAFER, METHOD FOR PREPARING CRYSTAL BAR, AND USE OF SINGLE-CRYSTAL WAFER

TECHNICAL FIELD

The present invention relates to a monocrystalline germanium (Ge) wafer, a method for preparing the monocrystalline germanium wafer, a method for preparing ingots from which the monocrystalline germanium wafer is sliced and the use of the monocrystalline germanium wafer obtained according to the present invention.

BACKGROUND

High-efficient, high-power solar cells have been widely used in space solar systems and large-scale ground-based solar concentrator systems. For such high-efficient, high-power multi-junction solar cells, germanium single-crystal wafer is an ideal substrate material. Germanium single-crystal materials currently in use are P-type germanium single-crystal substrates doped with gallium, in which the carriers are positive electrons, also known as holes. During the growth of germanium single-crystals, the gallium atoms having a segregation coefficient of only 0.087 are gradually enriched in liquid phase, such that the concentration of gallium atoms is gradually increasing from the head to the tail of the grown single-crystals. Here, the segregation coefficient is understood as follows: when an impurity element having different solubilities in solid and liquid phase is present at a solid-liquid interface, it has different concentrations at each side of the interface, and this is the so-called segregation phenomenon of the impurity; the extent of such segregation is often expressed as the segregation coefficient: "Separation coefficient"=(solubility of the impurity in solid phase)/(solubility of the impurity in liquid phase). The impurity segregation phenomenon leads to a difference in resistivity between the head and tail of the ingot. If the resistivity difference is more than six times, it would adversely affect the consistency of performance in the preparation of multi-junction solar cells.

SUMMARY OF THE INVENTION

In order to solve the above technical problems, the present invention is proposed, in which the co-doping with gallium and boron atoms, which have different segregation coefficients in germanium materials, makes it possible to achieve a uniform carrier concentration and an even distribution of resistivity.

Specifically, the object of the present invention is achieved by adjusting the amount of the co-dopants including silicon, boron and gallium, the ratio therebetween, as well as the temperature gradient and the growth rate in the growth of monocrystalline germanium.

More specifically, the present invention relates to the following technical solutions.

The present invention provides a monocrystalline germanium wafer, wherein the monocrystalline germanium wafer contains, as dopant elements, silicon in an atomic concentration of from $3 \times 10^{14}$ atoms/cc to $10 \times 10^{18}$ atoms/cc, boron in an atomic concentration of from $1 \times 10^{16}$ atoms/cc to $10 \times 10^{18}$ atoms/cc, and gallium in an atomic concentration of from $1 \times 10^{16}$ atoms/cc to $10 \times 10^{19}$ atoms/cc.

In a preferred embodiment of the monocrystalline germanium wafer according to the present invention, silicon has an atomic concentration of from $4 \times 10^{14}$ atoms/cc to $8 \times 10^{18}$ atoms/cc, boron has an atomic concentration of from $2 \times 10^{16}$ atoms/cc to $8 \times 10^{18}$ atoms/cc and gallium has an atomic concentration of from $2 \times 10^{16}$ atoms/cc to $9 \times 10^{19}$ atoms/cc.

In a more preferred embodiment of the monocrystalline germanium according to the present invention, silicon has an atomic concentration of from $5 \times 10^{14}$ atoms/cc to $7 \times 10^{18}$ atoms/cc, boron has an atomic concentration of from $4 \times 10^{16}$ atoms/cc to $7 \times 10^{18}$ atoms/cc and gallium has an atomic concentration of from $2 \times 10^{16}$ atoms/cc to $8 \times 10^{19}$ atoms/cc.

In a preferred embodiment of the monocrystalline germanium wafer according to the present invention, the monocrystalline germanium wafer has a ratio of an atomic concentration of boron to that of gallium in the range of from 8:1 to 1:240.

In a more preferred embodiment of the monocrystalline germanium wafer according to the present invention, the monocrystalline germanium wafer has a ratio of an atomic concentration of boron to that of gallium in the range of from 5:1 to 1:170.

In a particularly preferred embodiment of the monocrystalline germanium wafer according to the present invention, the monocrystalline germanium wafer has a ratio of an atomic concentration of boron to that of gallium in the range of from 3:1 to 1:100.

In a preferred embodiment of the monocrystalline germanium wafer according to the present invention, the monocrystalline germanium wafer has a ratio of an atomic concentration of silicon to that of gallium in the range of 4:1-100.

In a more preferred embodiment of the monocrystalline germanium wafer according to the present invention, the monocrystalline germanium wafer has a ratio of an atomic concentration of silicon to that of gallium in the range of 3:1-80.

In a particularly preferred embodiment of the monocrystalline germanium wafer according to the present invention, the monocrystalline germanium wafer has a ratio of an atomic concentration of silicon to that of gallium in the range of 2:1-50.

In a preferred embodiment of the monocrystalline germanium wafer according to the present invention, the monocrystalline germanium wafer has a thickness of 100-700 μm, preferably 100-500 μm, more preferably 100-200 μm, even more preferably 120-140 μm.

In a preferred embodiment of the monocrystalline germanium wafer according to the present invention, the monocrystalline germanium wafer has a sum A of the atomic concentrations of silicon, boron and gallium in the range of 2 ppm≤A≤120 ppm, preferably 4 ppm≤A≤70 ppm, based on the amount of germanium.

The present invention also provides a method for preparing monocrystalline germanium wafers, comprising:
1) slicing, from a monocrystalline germanium ingot containing silicon, boron and gallium, an initial monocrystalline germanium wafer, wherein the initial wafer contains silicon in an atomic concentration of from $3 \times 10^{14}$ atoms/cc to $10 \times 10^{18}$ atoms/cc, boron in an atomic concentration of from $1 \times 10^{16}$ atoms/cc to $10 \times 10^{18}$ atoms/cc and gallium in an atomic concentration of from $1 \times 10^{16}$ atoms/cc to $10 \times 10^{19}$ atoms/cc, and has a thickness of 200-800 μm;
2) grinding the edges of the initial monocrystalline germanium wafer obtained in step 1);

3) subjecting the initial monocrystalline germanium wafer ground in step 2) to a surface treatment; and
4) subjecting the initial monocrystalline germanium wafer surface-treated in step 3) to rough polishing and then to finish polishing to obtain a monocrystalline germanium wafer product, wherein the resulting monocrystalline germanium wafer product has a thickness of 100-700 μm.

In a preferred embodiment of the method for preparing a monocrystalline germanium wafer of the present invention, silicon has an atomic concentration of from $4\times10^{14}$ atoms/cc to $8\times10^{18}$ atoms/cc, boron has an atomic concentration of from $2\times10^{16}$ atoms/cc to $8\times10^{18}$ atoms/cc and gallium has an atomic concentration of from $2\times10^{18}$ atoms/cc to $9\times10^{19}$ atoms/cc.

In a more preferred embodiment of the method for preparing a monocrystalline germanium wafer according to the present invention, silicon has an atomic concentration of from $5\times10^{14}$ atoms/cc to $7\times10^{18}$ atoms/cc, boron has an atomic concentration of from $4\times10^{18}$ atoms/cc to $7\times10^{18}$ atoms/cc and gallium has an atomic concentration of from $2\times10^{16}$ atoms/cc to $8\times10^{19}$ atoms/cc.

In a preferred embodiment of the method for preparing a monocrystalline germanium wafer according to the present invention, the monocrystalline germanium wafer has a ratio of an atomic concentration of boron to that of gallium in the range of from 8:1 to 1:240.

In a more preferred embodiment of the method for preparing a germanium single wafer according to the present invention, the monocrystalline germanium wafer has a ratio of an atomic concentration of boron to that of gallium in the range of from 5:1 to 1:170.

In a particularly preferred embodiment of the method for preparing a germanium single wafer according to the present invention, the monocrystalline germanium wafer has a ratio of an atomic concentration of boron to that of gallium in the range of from 3:1 to 1:100.

In a preferred embodiment of the method for preparing a monocrystalline germanium wafer according to the present invention, the monocrystalline germanium wafer has a ratio of an atomic concentration of silicon to that of gallium in the range of 4:1-100.

In a more preferred embodiment of the method for preparing a monocrystalline germanium wafer according to the present invention, the monocrystalline germanium wafer has a ratio of an atomic concentration of silicon to that of gallium in the range of 3:1-80.

In a particularly preferred embodiment of the method for preparing a monocrystalline germanium wafer according to the present invention, the monocrystalline germanium wafer has a ratio of an atomic concentration of silicon to that of gallium in the range of 2:1-50.

In a preferred embodiment of the method for preparing a monocrystalline germanium wafer according to the present invention, the monocrystalline germanium wafer has a thickness of 100-700 μm, preferably 100-500 μm, more preferably 100-200 μm, even more preferably 120-140 μm.

In a preferred embodiment of the method for preparing a monocrystalline germanium wafer according to the present invention, the monocrystalline germanium wafer has a sum A of the atomic concentrations of silicon, boron and gallium in the range of 2 ppm≤A≤120 ppm, preferably 4 ppm≤A≤70 ppm, based on the amount of germanium.

Further, the present invention provides a method for preparing a monocrystalline germanium ingot, comprising:
1) charging a first raw germanium material, co-dopant elements including silicon, boron and gallium and optionally a liquid sealer into a crucible that has been pre-loaded with a seed crystal of high-purity monocrystalline Ge in a seed well;
2) charging a second raw germanium material for supplementing the first raw germanium material into a loading container, wherein the loading container is optionally loaded with a liquid sealer;
3) placing the crucible described in step 1) and the loading container described in step 2) in a quartz tube, and sealing the quartz tube under vacuum;
4) placing the sealed quartz tube with the crucible and the loading container described in step 3) into a crystal growth furnace having a movable support that supports the quartz tube;
5) melting the first and second raw germanium materials to a first and second melt respectively, and then adding all the melted second raw germanium material contained in the loading container, into the crucible;
6) cooling the melt in the crucible obtained in step 5) with a controlled temperature gradient and a controlled cooling rate, so that the melt crystallizes when in contact with the seed crystal and forms a monocrystalline germanium ingot; and
7) cooling the monocrystalline germanium ingot;
wherein the dopants silicon, boron and gallium added in step 1) are in such amounts that the resulting monocrystalline germanium ingot contains, within the effective length, silicon in an atomic concentration of from $3\times10^{14}$ atoms/cc to $10\times10^{18}$ atoms/cc, boron in an atomic concentration of from $1\times10^{16}$ atoms/cc to $10\times10^{18}$ atoms/cc, and gallium in an atomic concentration of from $1\times10^{16}$ atoms/cc to $10\times10^{19}$ atoms/cc.

In a preferred embodiment of the method for preparing a monocrystalline germanium ingot according to the present invention, the monocrystalline germanium ingot contains, within the effective length, silicon in an atomic concentration of from $4\times10^{14}$ atoms/cc to $8\times10^{18}$ atoms/cc, boron in an atomic concentration of from $2\times10^{16}$ atoms/cc to $8\times10^{18}$ atoms/cc and gallium in an atomic concentration of from $2\times10^{16}$ atoms/cc to $9\times10^{19}$ atoms/cc.

In a more preferred embodiment of the method for preparing a monocrystalline germanium ingot according to the present invention, the monocrystalline germanium ingot contains, within the effective length, silicon in an atomic concentration of from $5\times10^{14}$ atoms/cc to $7\times10^{18}$ atoms/cc, boron in an atomic concentration of from $4\times10^{16}$ atoms/cc to $7\times10^{18}$ atoms/cc and gallium in an atomic concentration of from $2\times10^{16}$ atoms/cc to $8\times10^{19}$ atoms/cc.

In a preferred embodiment of the method for preparing a monocrystalline germanium ingot according to the present invention, the monocrystalline germanium ingot has, within the effective length, a sum A of the atomic concentration of silicon, boron and gallium in the range of 2 ppm≤A≤120 ppm, preferably 4 ppm≤A≤70 ppm, based on the amount of germanium.

In a preferred embodiment of the method for preparing a monocrystalline germanium ingot according to the present invention, the head of the ingot has a ratio of an atomic concentration of boron to that of gallium in the range of 8-5:1, preferably 7-4:1, more preferably 5-3:1, and the tail of the ingot has a ratio of an atomic concentration of boron to that of gallium in the range of 1:100-240, preferably 1:130-210, more preferably 1:160-180.

In a preferred embodiment of the method for preparing a monocrystalline germanium ingot according to the present invention, the ratio of an atomic concentration of silicon to that of gallium is 4:1-100.

In a more preferred embodiment of the method for preparing a monocrystalline germanium ingot according to the present invention, the ratio of an atomic concentration of silicon to that of gallium is 3:1-80.

In a particularly preferred embodiment of the method for preparing a monocrystalline germanium ingot according to the present invention, the ratio of an atomic concentration of silicon to that of gallium is 2:1-50.

In a preferred embodiment of the method for preparing a monocrystalline germanium ingot according to the present invention, the monocrystalline germanium ingot is a crystalline ingot having a circular cross section with a diameter of no more than 10 inches.

In a preferred embodiment of the method for preparing a monocrystalline germanium ingot according to the present invention, in step 6) where the melt crystallizes when in contact with the seed crystal and forms a monocrystalline germanium ingot, a temperature gradient of 0.3-4.0° C./cm is created in the ingot growth zone.

In a more preferred embodiment of the method for preparing a monocrystalline germanium ingot according to the present invention, a temperature gradient of 0.5-3.5° C./cm is created in the ingot growth zone.

In a particularly preferred embodiment of the method for preparing a monocrystalline germanium ingot according to the present invention, a temperature gradient of 1.0-3.0° C./cm is created in the ingot growth zone.

In a preferred embodiment of the method for preparing a monocrystalline germanium ingot according to the present invention, in step 6) where the melt crystallizes when in contact with the seed crystal and forms a monocrystalline germanium ingot, a temperature gradient of 0.2-1.5° C./cm is created at the seed crystal end.

In a more preferred embodiment of the method for preparing a monocrystalline germanium ingot according to the present invention, a temperature gradient of 0.2-1.0° C./cm is created at the seed crystal end.

In a particularly preferred embodiment of the method for preparing a monocrystalline germanium ingot according to the present invention, a temperature gradient of 0.2-0.5° C./cm is created at the seed crystal end.

In a preferred embodiment of the method for preparing a monocrystalline germanium ingot according to the present invention, the temperature of the furnace is cooled in step 6) at a rate of 0.2° C./h to 0.6° C./h.

In a more preferred embodiment of the method for preparing a monocrystalline germanium ingot according to the present invention, the temperature of furnace is cooled in step 6) at a rate of 0.3° C./h to 0.5° C./h.

In a preferred embodiment of the method for preparing a monocrystalline germanium ingot according to the present invention, the wafer sliced from the head of the monocrystalline germanium ingot has an average dislocation density of less than $80/cm^2$, and the wafer sliced from the tail of the monocrystalline germanium ingot has an average dislocation density of less than $75/cm^2$.

The present invention also provides the use of the monocrystalline germanium wafer according to the present invention, a monocrystalline germanium wafer prepared by the method for preparing a monocrystalline germanium wafer according to the present invention, and a monocrystalline germanium wafer sliced from the monocrystalline germanium ingot prepared by the method for preparing a monocrystalline germanium ingot according to the present invention for increasing open-circuit voltage of multi-junction solar cells.

The present invention, by co-doping with gallium, boron and silicon, makes it possible to prepare a monocrystalline germanium ingot with uniform electrical properties, and thus, a multi-junction solar cells based on said monocrystalline germanium (Ge) wafer with increased open-circuit voltage. Meanwhile, there is a more even distribution of the carrier concentration and electrical properties in the entire monocrystalline germanium ingot, and thus, the multi-junction solar cell based on the monocrystalline germanium wafer can have more uniform properties.

The monocrystalline germanium wafer obtained according to the present invention has improved electrical properties, especially a smaller difference in resistivity and carrier concentration. Specifically, the difference in resistivity of the monocrystalline germanium ingot according to the present invention is not more than 2 times.

The monocrystalline germanium wafer obtained according to the present invention can also allow the preparation of a solar cell with increased open-circuit voltage, and thus, improved photoelectric conversion efficiency and power output.

According to the present invention, the increased open-circuit voltage Voc of the solar cell device is caused by the control, reduction or elimination of the recombination position of photo-generated carriers.

The present invention, by adding a certain amount of trace co-dopants to the monocrystalline germanium ingot, or the monocrystalline substrate, makes it possible to prepare multi-junction solar cells with increased open-circuit voltage. It is believed that the reason for the increased open-circuit voltage is the reduction and elimination of the antiphase domain boundaries at the bottom cell interface of the multi-junction solar cells epitaxially grown on the germanium substrate, and hence, the reduction of the non-radiative recombination of photo-generated carriers at the bottom cell interface.

DETAILED DESCRIPTION OF THE INVENTION

Figure 1:
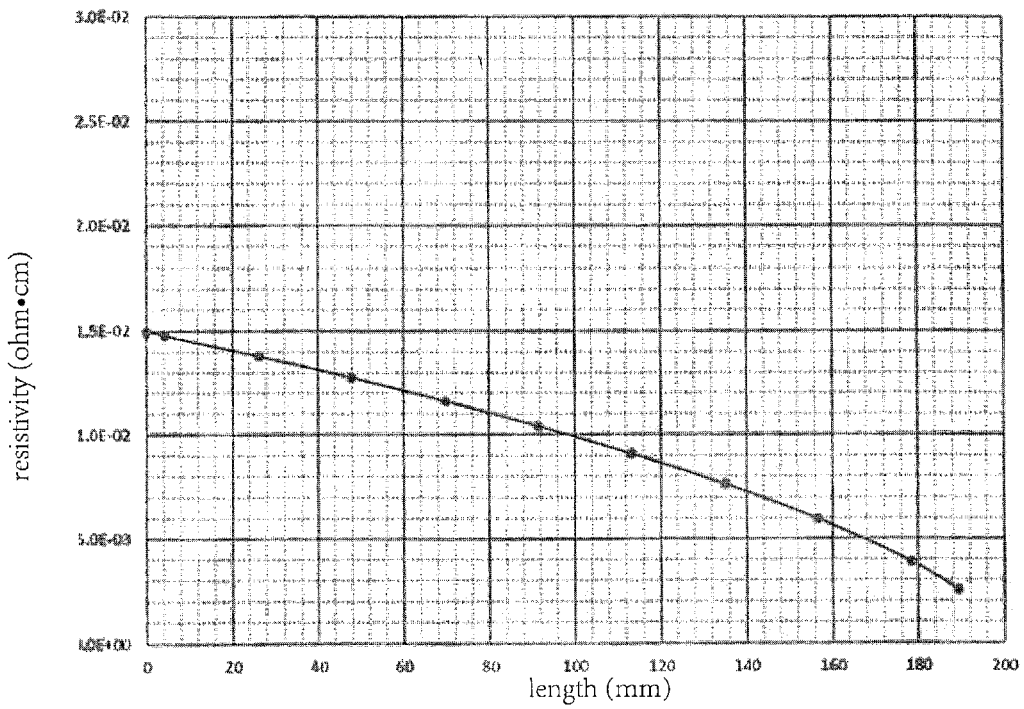
FIG. 1 is a graph showing the resistivity (Res) distribution from the head to the tail of a monocrystalline germanium doped with gallium in the prior art, wherein the horizontal axis from the left to the right represents the length of the crystalline ingot from the head to the tail, and the vertical axis is the resistivity at the respective position; wherein the head resistivity of 1.5E–2 Ohm·cm is 5.9 times the tail resistivity of 2.54E–3 Ohm·cm.
Figure 2:
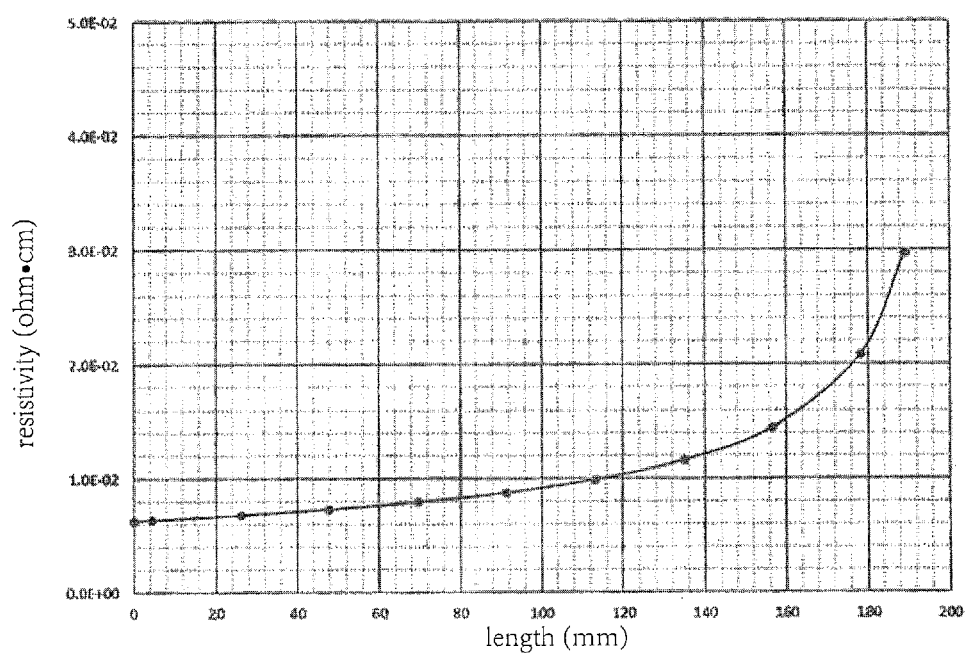
FIG. 2 is a graph showing the resistivity distribution from the head to the tail of a monocrystalline germanium doped with boron in the prior art, wherein the horizontal axis from the left to the right represents the length of the crystalline ingot from the head to the tail, and the vertical axis is the resistivity at the respective position; wherein the tail resistivity of 2.98E–2 Ohm·cm is 4.7 times the head resistivity of 6.3E–3 Ohm·cm.

In the present invention, all operations are performed at room temperature and under normal pressure unless otherwise specified.

In the present invention, the diameter of the wafer should be understood as follows: when the wafer is circular, the diameter of the wafer refers to the diameter of the circle; when the wafer is in other shapes (such as an irregular circle, a square and a rectangle), it refers to the diameter of a circle that is centered at the wafer center and covers all parts of the wafer.

In the present invention, the term "effective length" means the actual length of an ingot that can be sliced into wafers.

In the present invention, the co-dopants refer to any other elements than the element germanium, and particularly, the elements silicon (Si), boron (B) and gallium (Ga).

In the present invention, resistivity is measured by the method described in the GB/T 26074-2010, *Germanium Single Crystal Resistivity Direct Current Four-Probe Measurement Method*.

Wafers

The present invention provides a monocrystalline germanium wafer, wherein the monocrystalline germanium wafer contains, as dopant elements, silicon in an atomic concentration of from $3 \times 10^{14}$ atoms/cc to $10 \times 10^{18}$ atoms/cc, boron in an atomic concentration of from $1 \times 10^{16}$ atoms/cc to $10 \times 10^{18}$ atoms/cc, and gallium in an atomic concentration of from $1 \times 10^{16}$ atoms/cc to $10 \times 10^{19}$ atoms/cc.

In the monocrystalline germanium wafer according to the present invention, silicon preferably has an atomic concentration of from $4 \times 10^{14}$ atoms/cc to $8 \times 10^{18}$ atoms/cc, more preferably $5 \times 10^{14}$ atoms/cc to $7 \times 10^{18}$ atoms/cc; boron preferably has an atomic concentration of from $2 \times 10^{16}$ atoms/cc to $8 \times 10^{18}$ atoms/cc, more preferably $4 \times 10^{16}$ atoms/cc to $7 \times 10^{18}$ atoms/cc; and gallium preferably has an atomic concentration of from $2 \times 10^{16}$ atoms/cc to $9 \times 10^{19}$ atoms/cc, more preferably $2 \times 10^{16}$ atoms/cc to $8 \times 10^{19}$ atoms/cc.

In the present invention, the unit "atoms/cc" means "atoms/cubic centimeter".

Alternatively, in the monocrystalline germanium wafer according to the present invention, the atomic concentration of silicon is 0.5-25 ppm based on the amount of germanium, the atomic concentration of boron is 0.1-200 ppm based on the amount of germanium, and the atomic concentration of gallium is 1-100 ppm based on the amount of germanium.

Alternatively, in the monocrystalline germanium wafer according to the present invention, the atomic concentration of silicon is preferably of 2-20 ppm, more preferably 3-15 ppm, based on the amount of germanium; the atomic concentration of boron is 5-180 ppm, more preferably 10-160 ppm, based on the amount of germanium; and the atomic concentration of gallium is preferably 10-80 ppm, more preferably 20-60 ppm, based on the amount of germanium.

In the monocrystalline germanium wafer according to the present invention, the sum A of the atomic concentrations of silicon, boron and gallium is in the range of 2 ppm≤A≤120 ppm, preferably 4 ppm≤A≤70 ppm, based on the amount of germanium.

The present invention, by co-doping with silicon and boron, which have different segregation coefficients in the germanium material, makes it possible to achieve a uniform concentration of carriers and an even resistivity distribution between the monocrystalline germanium wafers and also within a monocrystalline germanium ingot. This is because the boron atom, which is of the same family as gallium, also can be used as P-type dopants in monocrystalline germanium, and the boron atom has a segregation coefficient of 18 in monocrystalline germanium, such that it is enriched in solid phase during the growth of monocrystalline germanium, thus leading to a decreasing atomic concentration of boron in the residual liquid phase, and an increasing resistivity.

In the monocrystalline germanium wafer according to the present invention, the ratio of an atomic concentration of boron to that of gallium is 8:1 to 1:240, preferably 5:1 to 1:170, more preferably 3:1 to 1:100.

In the monocrystalline germanium wafer according to the present invention, the ratio of an atomic concentration of silicon to that of gallium is 4:1-100, preferably 3:1-80, more preferably 2:1-50.

The monocrystalline germanium wafer according to the present invention has a thickness of 100-700 μm, preferably 100-500 μm, more preferably 100-200 μm, even more preferably 120-140 μm.

The monocrystalline germanium wafer according to the present invention is sliced from a monocrystalline germanium ingot. The monocrystalline germanium ingot is an ingot with a circular transverse cross-section (referred to as circular ingot) and a rectangle or square longitudinal cross-section. The diameter of the circular cross-section is generally no more than 10 inches, preferably 1-8 inches, preferably 2-6 inches, and even more preferably 2-4 inches. Certainly, the monocrystalline germanium ingot can also be an ingot with a transverse cross-section of other shapes, for example, square or rectangular after the processing of a circular ingot, when the wafer sliced is a non-circular monocrystalline germanium wafer.

The monocrystalline germanium wafer according to the present invention is preferably sliced from an ingot prepared by the method for preparing an ingot as described hereinafter.

The element silicon is infinitely miscible in germanium matrix. Surprisingly, the present inventors have found that the electrical properties of monocrystalline germanium can be significantly improved by the co-doping effect caused by co-adding in the raw germanium materials, boron in combination with silicon and gallium. Specifically, the co-doping of the present invention makes it possible to prepare monocrystalline germanium wafers with smaller difference in resistivity therebetween, and to provide the resulting multi-junction solar cell with significantly increased open-circuit voltage.

Method for Preparing Wafers

The present invention also provides a method for preparing monocrystalline germanium wafers, comprising:
1) slicing, from a monocrystalline germanium ingot containing silicon, boron and gallium, an initial monocrystalline germanium wafer, wherein the initial wafer contains silicon in an atomic concentration of from $3 \times 10^{14}$ atoms/cc to $10 \times 10^{18}$ atoms/cc, boron in an atomic concentration of from $1 \times 10^{16}$ atoms/cc to $10 \times 10^{18}$ atoms/cc and gallium in an atomic concentration of from $1 \times 10^{16}$ atoms/cc to $10 \times 10^{19}$ atoms/cc, and has a thickness of 200-800 µm;
2) grinding the edges of the initial monocrystalline germanium wafer obtained in step 1);
3) subjecting the initial monocrystalline germanium wafer ground in step 2) to a surface treatment; and
4) subjecting the initial monocrystalline germanium wafer surface-treated in step 3) to rough polishing and then to finish polishing to obtain a monocrystalline germanium wafer product, wherein the resulting monocrystalline germanium wafer product has a thickness of 100-700 µm.

The preferred and more preferred embodiments described above in connection with the monocrystalline germanium wafer are also applicable to the method for preparing monocrystalline germanium wafers according to the present invention, and therefore, are not repeated here.

The monocrystalline germanium ingot used in the method for preparing a monocrystalline germanium wafer according to the present invention is preferably prepared by the method for preparing an ingot described hereinafter.

In the method for preparing a monocrystalline germanium wafer according to the present invention, the slicing in step 1) is performed in a slicing machine, including an external circular slicing machine, an internal circular slicing machine, or a multi-wire slicing machine known in the art. The latter has a good productivity and wafer yield, and thus, is preferred. The multi-wire slicing machine usable in the present invention can be, for example, the multi-wire slicing machine MWM442DM, commercially available from Komatsu NTC, Japan.

The ingot is sliced in a slicing machine, with slurry and steel wire saw. The slurry can be formulated from powdered substances and cutter lubricant. The powdered substance is known in the art and is commercially available, and may be, for example, diamond powder, boron carbide, and silicon carbide. In general, the particle size of the powdered substance can be selected, and in principle, powdered substances with a particle diameter of 5-15 microns for formulating the slurry used for slicing semiconductor ingots can be used. The particle size of the powdered substance is preferably 6-13 microns, more preferably 8-12 microns. The cutter lubricant is also known in the art and is commercially available, and may be vegetable oil (for example olive oil and soybean oil), or mineral oil. In the present invention, the powdered substance is preferably silicon carbide, and the cutter lubricant is preferably mineral oil.

In the method for preparing monocrystalline germanium wafers according to the present invention, the particle size can be measured by a commercially available particle size analyzer, for example, Mastersizer® 3000 laser diffraction particle size analyzer from Malvern.

In the present invention, a monocrystalline germanium ingot to be sliced can be fixed in order to reduce movement of the monocrystalline germanium ingot and improve the surface quality, the. The fixing mean is not particularly limited, provided that it can effectively prevent the monocrystalline germanium ingot from moving during the slicing process. The monocrystalline germanium ingot is preferably fixed using a fixing device with semi-enclosure structure to facilitate separation of the wafers in a subsequent step.

Figure 10:
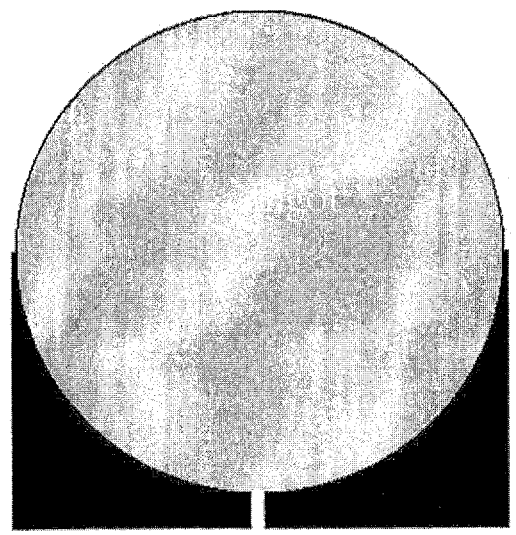
FIG. 10 is a schematic diagram showing the semi-enclosure graphite of an ingot fixing device used in the method for preparing a wafer according to the present invention.

The material for preparing the fixing device having semi-enclosure structure is not particularly limited, provided that the material will not deform or adversely affect the sliced wafer during slicing. For example, graphite can be used. In the present invention, the preferred fixing device having semi-enclosure structure is semi-enclosure graphite (as shown in FIG. 10).

Figure 11:
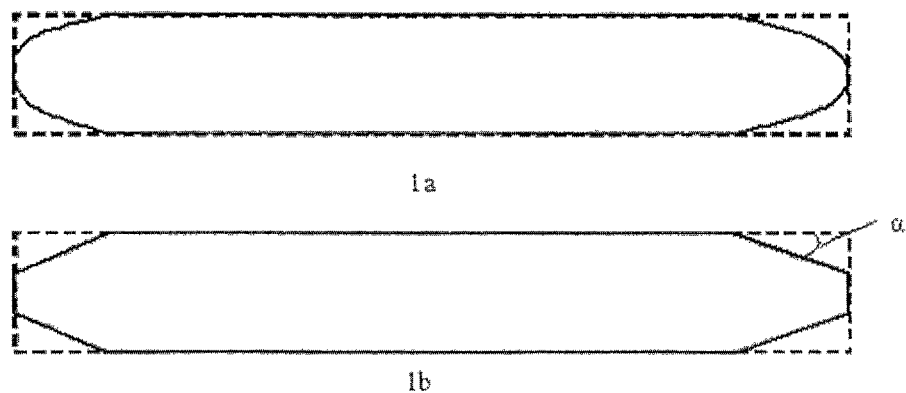
FIG. 11 is a schematic diagram showing the chamfered wafers in the method for preparing a wafer according to the present invention, wherein the chamfered corner in FIG. 11-1$a$ is in an arc shape, and in FIG. 11-1$b$ is in a slope shape.

In the method for preparing a monocrystalline germanium wafer according to the present invention, the initial monocrystalline germanium wafer is edge-grounded, and particularly, is chamfered (as shown in FIG. 11-1a and FIG. 11-1b), in order to provide the edge of the wafer with a suitable shape including arc (FIG. 11-1a) or slope (FIG. 11-1b, where a is preferably 45±10°). FIGS. 11-1a and 11-1b are cross-sectional views of the wafer before and after chamfering. Preferably, the chamfered monocrystalline germanium wafer has an arc-shaped edge in cross-section (FIG. 11-1a), such that the monocrystalline germanium wafer has low or no risk of breakage in subsequent steps. The chamfering process in this step is usually performed using any machines known in the prior art. Particularly, when a chamfering machine is used, the feed amount of the chamfering machine is preferably set within 0.4 mm, preferably within 0.3 mm.

In the method for preparing a monocrystalline germanium wafer according to the present invention, the edge-grounded initial monocrystalline germanium wafer is subjected to a surface treatment. The surface treatment can be performed onto the edge-grounded initial monocrystalline germanium wafer using a grinding machine. If it is necessary to grind both sides of the wafer, one side is ground before the other is ground. The grinding process is to eliminate sawing damage caused during the slicing process on the surface of the initial monocrystalline germanium wafer, so as to obtain a wafer with sufficient flatness to be prepared for the subsequent polishing process. The grinding may be carried out in any means known in the art. For example, it can be carried out in an existing grinding apparatus (for example, similar to the one shown in FIG. 12), wherein the initial monocrystalline germanium wafer is placed in a supporting pad, with two grinding pads (usually being made of polyester) on the upper and lower sides, and a grinding liquid (known from the prior art) is used during the grinding process. For example, when a grinding apparatus with an upper and lower disc rotating in reverse is used, the wafer during the grinding process is applied with the pressure of 0.03-0.18 kg/cm$^2$, preferably 0.05-0.15 kg/cm$^2$. The upper disk has a rotation speed of 2-12 rpm, preferably 3-10 rpm; the lower disk has a rotation speed of 5-20 rpm, preferably 8-15 rpm. The volume of the grinding liquid used is 60-120 ml/m$^2$ grinding disc areas/min (calculated per one side of the equipment disc). The time period of grinding is 20-50 min, preferably 25-40 min.

Alternatively, in the method for preparing a monocrystalline germanium wafer according to the present invention, the surface treatment can also be performed by a chemical method. In such case, for example, the initial monocrystalline germanium wafer may be immersed in or rinsed with an etching liquid. The etching liquid may be a conventional one used in the art for surface treatment of initial monocrystalline germanium wafers.

Certainly, a grinding machine and a chemical surface treatment method can be used in combination when necessary, in which case for example, the grinding machine is used first, and then the chemical surface treatment is performed.

In the method for preparing a monocrystalline germanium wafer according to the present invention, preferably, the sliced initial monocrystalline germanium wafer is exclusively subjected to a chemical surface treatment with an etching liquid. The chemical surface treatment is carried out at a temperature at room temperature or higher, preferably 30° C. or higher, and more preferably 35° C. or higher, for a time period of 5-20 seconds, preferably 8-18 seconds, more preferably 10-15 seconds. Preferably, the etching liquid is a solution of NH$_3$ and hydrogen peroxide in water, wherein NH$_3$ is 0.1-5 mol %, hydrogen peroxide is 5-15 mol %, and the balance is water. The thus surface-treated wafer is free of marks of chemicals at the surface.

In the method for preparing a monocrystalline germanium wafer according to the present invention, the method further comprises rough polishing and then finish polishing the surface-treated monocrystalline germanium wafer.

Regarding rough polishing, i.e. mechanical chemical polishing, the solution used contains, in addition to water, dichloroisocyanurates, sulfonates, pyrophosphates, bicarbonates and silica sols. In a preferred embodiment of the present invention, in addition to water, the rough polishing solution contains in weight percentage, 8.0-22.0% of dichloroisocyanurate, 0.01-0.30% of sulfonate, 4.5-19.0% of pyrophosphate, 3.0-13.0% of bicarbonate and 55.0-72.0% of silica sol, based on the total amount of the components except water, wherein the total content of each component is 100%. The total concentration in weight percentage of these components, after being dissolved in water, is limited so as not to exert adverse effect on the wafer, and it may be value, but preferably not higher than 6.0%.

For the rough polishing, when using a polishing apparatus with an upper and lower disc rotating in reverse, the wafer during the polishing process is applied with a pressure of 0.04-0.15 kg/cm$^2$, preferably 0.05-0.12 kg/cm$^2$. The speed of the upper disk is 10-45 rpm, preferably 12-35 rpm; the speed of the lower disk is 5-40 r/min, preferably 8-30 rpm. The flow rate of the polishing liquid is 60-120 L/cm$^2$ wafer area/hour. The polishing time is 20-70 min, preferably 25-60 min.

For the finish polishing, i.e. chemical mechanical polishing, the solution used contains, in addition to water, dichloroisocyanurates, sulfonates, acidic pyrophosphates, bicarbonates, and carbonates. In a preferred embodiment of the present invention, in addition to water, the finish polishing solution contains in weight percentage, 29.00-40.00% of dichloroisocyanurate, 0.20-0.45% of sulfonate, 18.00-35.00% of acidic pyrophosphate, 17.00-24.00% of bicarbonate and 15.00-23.00% of carbonate, based on the total amount of the components except water, wherein the total content of each component is 100%. The total concentration in weight percentage of these components, after being dissolved in water, is limited so as not to exert adverse effect on the wafer, and it may be any value, but preferably not higher than 3.0%.

For the finish polishing, when using a polishing apparatus with an upper and lower disc rotating in reverse, the wafer during the polishing process is applied with a pressure of 0.05-0.15 kg/cm$^2$, preferably 0.06-0.12 kg/cm$^2$. The speed of the upper disc is 20-60 rpm, preferably 25-50 rpm; and the speed of the lower disc is 10-35 rpm, preferably 12-25 rpm. The flow rate of the polishing fluid is 0.5-1.0 ml/cm$^2$ wafer areas/min. The polishing time is 3-20 minutes, preferably 5-15 minutes.

In the polishing solutions of the present invention, the dichloroisocyanurate, (acidic) pyrophosphate, bicarbonate and carbonate used can be a water-soluble salt thereof. Preference is given to a water-soluble alkali metal salt or ammonium salt of dichloroisocyanurate, (acidic) pyrophosphate, bicarbonate and carbonate, and particular preference is given to sodium salt or ammonium salt.

Regarding the silica sol, any conventional ones can be used, such as commercially available silica sols, or silica sols prepared using the prior art method.

The sulfonate used can be a water-soluble sulfonate, preferably a water-soluble alkali metal salt or ammonium salt, and particularly preferably sodium salt or ammonium salt. Preferably, the sulfonate used is one selected from, for example, mono- or di-sulfonate of $C_{6-16}$ aryl (i.e., aryl containing 6-16 carbon atoms, including substituted aryl) (e.g., $C_{4-10}$ alkylbenzene sulfonate, benzene sulfonate, naphthalene sulfonate, anthracene sulfonate, $C_{4-10}$ alkylbenzene disulfonic acid di-salt, phenyl disulfonic acid di-salt, naphthyl disulfonic acid di-salt or anthryl disulfonic acid di-salt, such as 1,2-benzenedisulfonic acid di-salt, 1,3-benzenedisulfonic acid di-salt, benzene sulfonate or naphthalene sulfonate), an alkyl sulfonate (preferably sulfonates of alkyl containing 4-10 carbon atoms, such as a butyl sulfonate, pentyl sulfonate, hexyl sulfonate, heptyl sulfonate, octyl sulfonate, nonyl sulfonate and decyl sulfonate) and a sulfocarbolate, and more preferably, from 1,3-benzene disulfonate, benzene sulfonate, naphthalene sulfonate or hexyl sulfonate.

Since rough polishing and finish polishing per se can be performed by the prior art method, a detailed description thereof will be omitted. In the present invention, preference is given to single-side polishing.

After rough polishing and finish polishing, the monocrystalline germanium wafer has a surface roughness of not higher than 0.5 nm, and a flatness of 3-7 μm, preferably 3-5 μm.

After rough polishing and finish polishing, the monocrystalline germanium wafer can have a surface roughness and a wafer flatness fulfilling the application specification in the art.

Optionally, the method for preparing a monocrystalline germanium wafer according to the present invention further comprises subjecting the finish-polished monocrystalline germanium wafer to a surface cleaning treatment.

Preference is given to wet surface cleaning treatment. The cleaning process is not particularly limited provided that it can achieve the desired degree of surface cleaning of the wafer. As to the wet cleaning treatment, any prior art means can be applied depending on the prepared monocrystalline germanium wafer.

Preferably, the wet surface cleaning is carried out in a cleanroom of no less than Class 1,000. The cleanroom rating is defined in the USA Federal Standard 209D cleanroom specifications (see Table 1 below). Here, only the number of dust particles is usually considered. For example, a Class 1000 cleanroom generally refers to that the number of particles ≥0.5 μm is ≤1000 per cubic foot; and the number of particles ≥5.0 μm is ≤10 per cubic foot. Preferably, after the surface cleaning treatment in step 4), the surface of the wafer is ascertained to be free of particles and free of white mist by visual inspection under light irradiation. And the residual amounts of the metal Zn and Cu on the surface of the wafer are respectively ≤10×10$^{10}$ atoms/cm$^2$. In this way, the monocrystalline germanium wafer obtainable by the method of the present invention can reach the ready-to-use level with no need of any further treatment before epitaxial growth. Since cleaning can be performed using the prior art method, no further details are provided herein.

5) melting the first and second raw germanium materials to a first and second melt respectively, and then adding all the melted second raw germanium material contained in the loading container, into the crucible;

6) cooling the melt in the crucible obtained in step 5) with a controlled temperature gradient and a controlled cooling rate, so that the melt crystallizes when in contact with the seed crystal and forms a monocrystalline germanium ingot; and 7) cooling the monocrystalline germanium ingot;

wherein the dopants silicon, boron and gallium added in step 1) are in such amounts that the resulting monocrystalline germanium ingot contains, within the effective length, silicon in an atomic concentration of from $3\times10^{14}$ atoms/cc to $10\times10^{18}$ atoms/cc, boron in an atomic concentration of from $1\times10^{16}$ atoms/cc to $10\times10^{18}$ atoms/cc, and gallium in an atomic concentration of from $1\times10^{16}$ atoms/cc to $10\times10^{19}$ atoms/cc, and the initial wafer has an thickness of 200-800 μm.

In the monocrystalline germanium wafer according to the invention, silicon preferably has an atomic concentration of from $4\times10^{14}$ atoms/cc to $8\times10^{18}$ atom/cc, more preferably

TABLE 1

USA Federal Standard 209D cleanroom specifications

| Clean room class | Dust particle | | Pressure mmAg | Temperature | | | | | | Wind velocity and ventilation rate (time/hr) | Illumination, lux |
|---|---|---|---|---|---|---|---|---|---|---|---|
| | Particle size (μm) | Particle Number (Particles/ft3) | | Value range ° C. | Recommended value ° C. | Error value ° C. | Max % | Min % | Error % | | |
| 1 | ≥0.5 | ≤1 | >1.3 | 19.4-25 | 22.2 | ±2.8 Special need ±1.4 | 45 | 30 | ±10 Special need ±5 | Laminar flow 0.35-0.55 m/s | 1080~1620 |
| | ≥5.0 | 0 | | | | | | | | | |
| 10 | ≥0.5 | ≤10 | | | | | | | | | |
| | ≥5.0 | 0 | | | | | | | | | |
| 100 | ≥0.5 | ≤100 | | | | | | | | | |
| | ≥5.0 | ≤1 | | | | | | | | | |
| 1000 | ≥0.5 | ≤1000 | | | | | | | | Turbulent flow ≥20 times/hr | |
| | ≥5.0 | ≤10 | | | | | | | | | |
| 10000 | ≥0.5 | ≤10000 | | | | | | | | | |
| | ≥5.0 | ≤65 | | | | | | | | | |
| 100000 | ≥0.5 | ≤100000 | | | | | | | | | |
| | ≥5.0 | ≤700 | | | | | | | | | |

Method for Preparing Ingot

Figure 6:
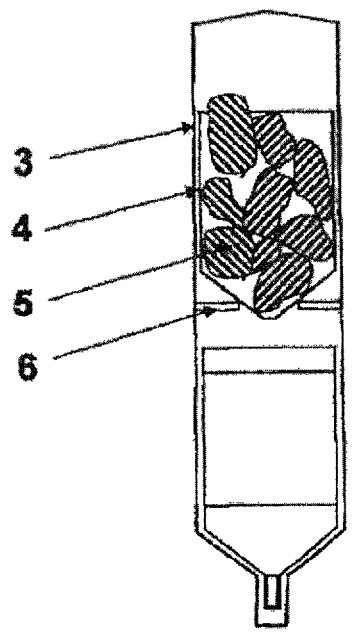
FIG. 6 is a front view of a sealed container for growing monocrystalline germanium.
Figure 7:
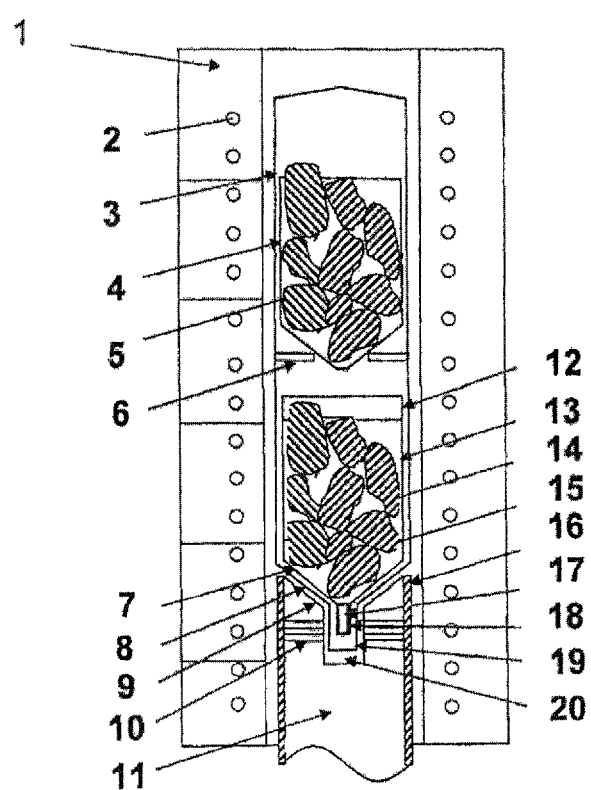
FIG. 7 is a sectional view of a crystal growth apparatus including a sealed container.
Figure 8:
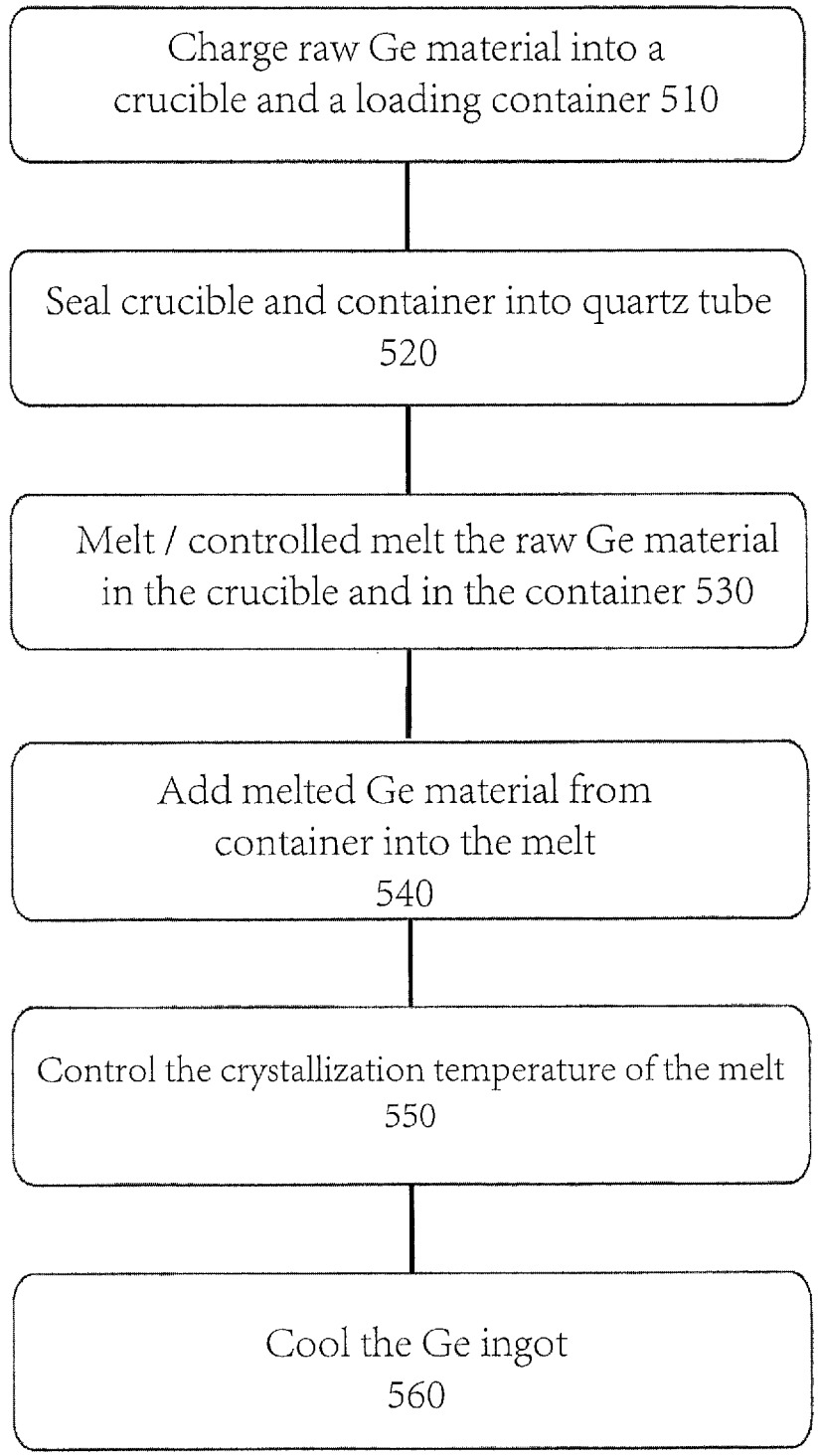
FIG. 8 is a flow chart of the whole process of growing a monocrystalline germanium ingot from raw germanium material using the sealed container shown in FIG. 6 and the apparatus for growing monocrystalline.
Figure 9:
FIG. 9 is a schematic diagram showing a three-junction solar cell using germanium substrate.

The present invention also provides a method for preparing a monocrystalline germanium ingot, comprising:

1) charging a first raw germanium material, dopant elements including silicon, boron and gallium, and optionally a liquid sealer into a crucible that has been pre-loaded with a seed crystal of high-purity monocrystalline Ge in a seed slot;

2) charging a second raw germanium material for supplementing the first raw germanium material into a loading container (as shown in FIGS. 6, 7 and 8), wherein the loading container is optionally loaded with a liquid sealer;

3) placing the crucible described in step 1) and the loading container described in step 2) in a quartz tube, and sealing the quartz tube under vacuum;

4) placing the sealed quartz tube with the crucible and the loading container described in step 3) into a crystal growth furnace having a movable support that supports the quartz tube;

$5\times10^{14}$ atoms/cc to $7\times10^{18}$ atoms/cc; boron preferably has an atomic concentration of from $2\times10^{16}$ atoms/cc to $8\times10^{18}$ atoms/cc, more preferably $4\times10^{18}$ atoms/cc to $7\times10^{18}$ atoms/cc; and gallium preferably has an atomic concentration of from $2\times10^{18}$ atoms/cc to $9\times10^{19}$ atoms/cc, more preferably $2\times10^{16}$ atoms/cc to $8\times10^{19}$ atoms/cc.

Alternatively, in the monocrystalline germanium wafer according to the present invention, the atomic concentration of silicon is 0.5-25 ppm based on the amount of germanium, the atomic concentration of boron is 0.1-200 ppm based on the amount of germanium, and the atomic concentration of gallium is 1-100 ppm based on the amount of germanium.

Alternatively, in the monocrystalline germanium wafer according to the present invention, the atomic concentration of silicon is preferably 2-20 ppm, more preferably 3-15 ppm based on the amount of germanium; and the atomic concentration of boron is 5-180 ppm, more preferably 10-160 ppm based on the amount of germanium; and the atomic concentration of gallium is preferably 10-80 ppm, more preferably 20-60 ppm based on the amount of germanium.

In the method for preparing a monocrystalline germanium ingot according to the invention, within an effective length of the monocrystalline germanium ingot, the head of the ingot has a ratio of the atomic concentration of boron to that of gallium in the range of 8-5:1, preferably 7-4:1, more preferably 5-3:1; and the tail of the ingot has a ratio of the atomic concentration of boron to that of gallium in the range of 1:100-240, preferably 1:130-210, and more preferably 1:160-180.

In the method for preparing a monocrystalline germanium ingot according to the invention, the monocrystalline germanium ingot, within an effective length, has a ratio of the atomic concentration of silicon to that of gallium in the range of 4:1-100, preferably 3:1-80, more preferably 2:1-50.

In the method for preparing a monocrystalline germanium ingot according to the invention, the monocrystalline germanium ingot, within an effective length, has a sum A of the atomic concentration of silicon, boron and gallium in the range of 2 ppm≤A≤120 ppm, preferably 4 ppm≤A≤70 ppm, based on the amount of germanium.

The raw germanium material used in the method for preparing an ingot according to the present invention is a high-purity raw germanium material. In the present invention, the term "high-purity germanium" means germanium with a resistivity of up to 4000 Ω·m and a purity of 99.999% or more. The high-purity raw germanium material doped with ultra-low content of dopants ensures the controlled reproducibility of the desired properties and performance of the germanium wafer, thereby ensuring the stability of solar cell devices prepared from germanium as substrates. High-purity raw germanium materials are commercially available, often in the form of brick or powder. In the present invention, preference is given to high-purity raw germanium material in the form of brick, for example, high-purity germanium brick commercially available from ZhongNuo Advanced Materials (Beijing) Technology Co., Ltd.

The container for the growth of monocrystalline germanium ingot can be a crucible made of a suitable material such as pyrolytic boron nitride (PBN), which is a relative stable material, and neither contaminates raw germanium material nor reacts with germanium melt at a temperature that is 100° C. higher than the melting point (933° C.) of germanium. The container or crucible for the growth of monocrystalline germanium ingot comprises a body, which may be cylindrical and has a diameter slightly larger than the diameter of the monocrystalline germanium ingot to be prepared (on the condition that the body can accommodate the entire ingot and the ingot does not contact with the wall of the cylindrical body); a small diameter seed well at the bottom, and a conical transition region between the bottom seed well and the cylindrical body (as shown in FIG. 6). The seed well is used for holding a cylindrical seed crystal prepared from high-purity monocrystalline germanium.

The crystal orientation of the upper end face of the seed crystal is corresponding to the surface crystal orientation of the desired monocrystalline germanium substrate such as (100) or surface orientation deflected by a certain angle to the adjacent crystal orientation axis relative to the (100) crystal orientation. Polycrystalline germanium bricks in suitable shapes are loaded into the growth crucible above the seed cavity.

If necessary, a suitable liquid sealer such as boron trioxide together with raw germanium material is placed into the lower crucible (also called "growth crucible", as shown in FIG. 6 and FIG. 7). The liquid sealer can isolate the inner wall of the crucible from the germanium melt, or from the surface of a germanium ingot solidified during the monocrystalline growth, thereby reducing the adhesion between the surface of the grown germanium ingot and the inner wall of the crucible, and facilitating the preparation of an intact monocrystalline germanium ingot. The liquid sealer is used at a conventional amount in the prior art.

Since the raw germanium material, after being melted, cannot fill the whole growth crucible, above the growth crucible is provided a loading container for containing the same raw germanium material. The container has a bottom hole, through which the raw germanium material contained therein is melted and dropped down into the growth crucible such that the growth crucible is filled with melted raw germanium material, as shown in FIG. 6. The loading container can be a crucible, in which case the loading container is also called a feeding crucible.

In the present invention, the monocrystalline germanium ingot is grown by vertical gradient freeze melt growth techniques. The apparatus for growing monocrystalline germanium, with which the method for preparing monocrystalline germanium ingots according to the present invention is performed, is described in U.S. Pat. No. 8,506,706 B2, which is incorporated herein by reference in its entirety.

The present invention is illustrated below with reference to the drawings.

FIG. 7 shows a cross sectional view of an example of an apparatus for growing monocrystalline germanium. The apparatus is a furnace commonly used in a vertical gradient freeze growth process, and may include a quartz tube support 11 in a furnace 1, wherein the heater 2 is composed of multiple zones, and each zone is individually controlled by a computer controlled by a control system. The temperature of each zone is adjusted to give the desired overall temperature profile and the temperature gradient required to control the solidification of the melt. The temperature profile and temperature gradient in the furnace are adjusted such that the crystallization interface moves predictably up through the melt, such as creating a temperature gradient of 0.3-4.0° C./cm, preferably 0.5-3.5° C./cm, and more preferably 1.0-3.0° C./cm in the ingot growth zone; and creating a lower temperature gradient of 0.2-1.5° C./cm, preferably 0.2-1.0° C./cm and more preferably 0.2-0.5° C./cm at the seed crystal end. The quartz tube support 11 provides physical support and thermal gradient control for the quartz tube 3 containing the crucible 12 (growth crucible), the crucible 12 in the quartz tube has a seed well 18 used for storing seed crystals. When the furnace runs, the said quartz tube support 11 can axially move up and down during the crystal growth process. The crucible 12 may contain a seed crystal 17, and the crystal grows into a single crystal along the top of the seed crystal. In one embodiment, the crucible 12 can be a pyrolytic boron nitride structure with a cylindrical crystal growth portion 13, a seed well cylinder 18 having a smaller diameter, and a tapered transition portion 7. The crystal growth portion 13 is open at the top of the crucible 12, and its diameter equals to the diameter of the desired crystal product. In an exemplary embodiment, the seed well cylinder 18 at the bottom of the crucible 12 may have an enclosed bottom and a diameter slightly larger than the diameter of high-quality seed crystal 17, for example, about 6-25 mm, and a length of about 30-100 mm. The cylindrical crystal growth portion 13 and the seed well cylinder 18 may have straight walls, or cone-shaped walls gradually expanding outward by about 1-30 degrees to facilitate the removal of the crystals in the crucible 12. The tapered transition portion 7 between the growth portion 13 and the seed tank cylinder 18 has an inclined side wall with an angle of, for example, about 45-60 degrees, and its larger diameter equals to the diameter of the growth zone and connects the walls of the growth zone, the smaller diameter equals to the diameter of the seed well and connects to the wall of the seed well. The angled sidewall may also have other angles that are steeper or less steep than 45-60 degrees.

The quartz tube 3 has a shape similar to that of the crucible 12. The quartz tube 3 is cylindrical in a seed growth region 19, cylindrical with a narrower diameter in its seed well region 19, and has a tapered transition region 8 between the two regions. The crucible 12 fits inside the quartz tube 3 with a narrow margin between them. An upper loading container 4, as a loading container (feeding crucible), is seated on a quartz support 6. The quartz support 6 is sealed in the middle part of the quartz tube 3. In one implementation of the invention, this feeding crucible 4 is made of pBN. It is this feeding crucible 4 into which most of the raw germanium material 5 (such as 60 to 80% by weight and preferably 60 to 70% by weight based on the raw germanium materials in the growth crucible and the feeding crucible) is charged. During the heating process, the raw germanium material is melted and dropped down into the crucible 12 from the bottom hole of the feeding crucible 4. The quartz tube 3 is closed at the bottom of its seed well region 19 and sealed on top after the crucible and raw materials are loaded.

Since the quartz tube-crucible combination has a funnel shape, the quartz tube support 11 is required to accommodate this funnel shape and hold the quartz tube 12 stable and upright inside the furnace. In other embodiments, the quartz tube-crucible combination may be in different shapes, and the basic structure of the quartz tube support 11 would be changed to fit the different shapes. According to one embodiment, the quartz tube and its contents are kept stable, and are provided with support strength through a solid, thin-walled cylinder 16 of the quartz tube support 11. The solid, thin-walled cylinder 16 accommodates the funnel end of the quartz tube structure 3. In one embodiment, the crucible support cylinder 16 is made of a heat conductive material, preferably quartz. In other embodiments, silicon carbide or ceramics can also be used to form the crucible support cylinder 16. The cylinder 16 makes a circumferential contact with the quartz tube 3, where the upper rim of the cylinder 16 meets the shoulder of the quartz tube's tapered region 8. Such configuration leads to minimal solid-to-solid contact, which ensures little or no undesirable, relatively uncontrollable heat conduction. Other more controllable methods therefore can be used for heating.

A low density insulating material, such as ceramic fiber, may fill the majority of the inside of the support cylinder 11 with only a hollow axial core 20 in approximately the center of the insulating material being left empty (filled with no insulating material) to receive the seed well 19 of the quartz tube 3.

The low-density insulating material may also comprise alumina fiber (with a melting point of 1,800° C.), alumina-silica fiber (with a melting point of 1,426° C.), and/or zirconia fiber (with a melting point of 2,200° C.). The insulating material is carefully placed in the quartz tube support 11. The weight of the quartz tube 3, as it sits on top of the cylinder 16, pushes the insulating material down and forms the slanted insulating material edge 9. Filling the majority of the cylinder interior with a low-density insulator reduces the flow of air, which ensures little or no undesirable, relatively uncontrollable convection flow. Like conduction, convection is an uncontrollable heat transfer method that works to the detriment of the VGF and other crystal growth process.

The hollow core 20, with a diameter approximately equal to the quartz tube seed well 19, extends downward to a small distance below the bottom of the quartz tube seed well 19. In another implementation, the hollow core 20 extends through the crucible support from the bottom of the seed well to the bottom of the furnace apparatus 1. The hollow core 20 provides a cooling path from the center of the crystal. It contributes to cooling in the seed well and in the center of the growing crystal. With this construction, heat energy can escape down through the center of the solid crystal and seed, down through this hollow core 20 in the insulating material within the crystal support 11. Without the hollow core 20, the temperature of the center of the cooling ingot would naturally be higher than that of the crystal material nearer to the outer surface. In this case, the center of the ingot in any horizontal cross section would crystallize later after its perimeter had solidified. Crystals with uniform electrical properties cannot be made under these conditions. With the creation of a hollow core 20 included in the crystal support method, heat energy is conducted down through the bottom of the quartz tube 3 and the hollow core 20 from where it radiates back out of radiation channels 10. It is important to reduce heat energy from the center of the growing crystal so that the isothermal layers are kept flat across the crystal diameter. Maintaining a flat crystal-melt interface allows the production of crystals with uniform electrical and physical properties.

The low-density insulating material within the cylinder 11 obstructs the flow of heat radiation from a set of furnace heat elements 2 to the quartz tube 3 in the seed well region 19; thus, this method requires the creation of a plurality of horizontal radiation channels/openings/tunnels 10 through the insulation material. The radiation channels 10 penetrate the insulating material to provide heat radiation outlets to controllably transfer heat from the furnace heating elements 2 to the quartz tube seed well 19. The number, shapes and diameters of the radiation channels 10 varies depending on specific conditions. The radiation channels may also be slanted, bent or wave-like. The radiation channels do not necessarily have to be continuous, as they may extend only partially through the insulating material. This helps minimize convection currents. In one implementation, the diameter of these channels is small, on the order of a pencil width, so that convection airflow is insignificant. According to other implementations of the invention, larger holes with cross-sectional area on the order of 6.4516 cm$^2$ (a square inch) or more can also be used. The radiation channels 10 through the insulating material also work in conjunction with the hollow core 20 in the center of the insulating material to radiate heat energy drawn from the center of the crystal, and cool the crystal with planar isothermal temperature gradient layers. The radiation channels 10 enable temperature control and directly relate to crystal growth yield.

In one exemplary implementation of the innovations herein, in the phase of monocrystalline germanium ingot growing, the furnace temperature may be decreased at a rate of about 0.2 to about 0.5° C./h to allow the monocrystalline germanium ingot to grow.

FIG. 7 illustrates an exemplary process of melting and supplying germanium. FIG. 7 illustrates an initial state, where the solid germanium is present in both the loading container 4 and the crucible 12. As innovative heating features and processes, an intermediate state of the germanium melt is shown, which illustrates a state wherein the solid germanium in the crucible 12 has been melted to a liquid.

The heating elements of the heating zones of the furnace are adjusted in association with the respective supply of power so that the upper container is provided with required heat energy. Specifically, the upper container may be heated such that the germanium in the upper container 3 begins melting, and the molten germanium flows into the crucible 12 via a hole at the bottom of container 3. In one exemplary implementation, the region of the furnace where the upper container is present is heated to the range of about 940 to about 955° C. This process continues until all of the germanium in the loading container flows into the crucible 12.

The furnace 1 as shown in FIG. 7 is an example of a furnace that may be used for a Vertical Gradient Freeze (VGF) crystal growth process. Other furnaces and configurations, such as Vertical Bridgman, may also be used. In the VGF crystal growth process, the crystallizing temperature gradient within a fixed heat source is being moved electrically while the crystal is stationary.

To carry out vertical gradient freeze growth (VGF), it is necessary to establish an appropriate temperature gradient profile in the furnace. The heating zones of the furnace are controlled separately and individually with regard to their respective power supplies via a computer that is programmed to heat and cool to fulfill the furnace crystallizing temperature and temperature gradient requirements. For the growing of germanium ingots, for example, the furnace temperature fluctuation may be required to be <±0.1° C. During the preparation of the furnace, the raw germanium polycrystalline material is loaded into the quartz tube 3 as described.

As shown in the figures, a pBN loading container 4 which has a hole in the tapered portion is seated on a support 6 which is made of quartz located above crucible 12 in the quartz tube 3. The loading container 4 allows the crucible 12 to be loaded with more raw materials. In particular, the raw germanium material 5 is typically solid bricks or pieces and therefore cannot be tightly packed into the crucible 12 to be melted. Thus, the loading container is used to hold extra raw material that can be melted and then drain down into the crucible 12 which results in a larger germanium charge in the crucible 12 which in turn results in a larger length and diameter germanium crystal. For example, about 65% of the raw material may be initially loaded into the loading container 4 and 35% of the raw material is loaded directly into the crucible 12.

In one example, silicon and gallium are used as dopants. A seed with (100) crystal orientation is loaded into the seed well inside the crucible before charging. The raw material and an appropriate amount of dopant are loaded into the crucible, and the crucible and the loading container are then placed into the quartz tube 3. The latter is connected with a vacuum system, and is evacuated to a vacuum of about $2.00\times10^{-4}$ Pascal (about $1.5\times10^{-6}$ Torr), after which the quartz tube is sealed and loaded into the furnace, as shown in FIG. 7. The furnace is started to heat the quartz tube and contents. The heating rate may be 5 to 40° C./min, preferably 10 to 30° C./min and more preferably 15 to 20° C./min, and the heating temperature is 1000° C.±50° C. (the melting point of germanium is about 940° C.). The temperature gradient at the crystallization interface may be adjusted to 0.2 to 10° C./cm depending on the position of the ingot. Further, the overall temperature profile may be adjusted to give a crystallization rate of about 1-2 mm/hr. After the solidification is completed, the furnace is cooled down at 20-40° C./h.

Monocrystalline germanium ingots produced under the above-mentioned exemplary growth process parameters have a very low defect density along its entire length and the defects are also uniformly distributed. The wafers sliced from the head and tail of a grown crystal are etched to measure the dislocation densities. The head and tail wafers have uniform dislocation densities. The head wafer may have an average dislocation density of less than $80/cm^2$, or $78/cm^2$, or $75/cm^2$, or $70/cm^2$, or $65/cm^2$. The tail wafer may have an average dislocation density of less than $75/cm^2$, or $70/cm^2$, or $65/cm^2$, or $66/cm^2$, or other value in a numerical window of 10%, 20% or 30% of the quantities measured or set forth herein. Using the process of the present invention, the defect densities are thus reduced by 15-20%. It is believed that the reason for the reduction of the defect densities is the solid-solution strengthening effect brought about by the co-dopants added during the crystal growth.

In the present invention, the dislocation density is measured by the method described in GB/T5252-2006 *Germanium Single Crystal Dislocation Etch Pit Density Measurement Methods*.

In another example, the inventive apparatus is composed of a quartz tube into which both the pBN loading container and the crucible may be inserted, along with a support 6 to hold the pBN loading container. The crucible may have a diameter of about 150 mm and a length of 160 mm in the crystal growing section, and a diameter of about 7 mm in the seed crystal section. In one exemplary implementation, a (100) oriented Ge seed crystal is inserted in the seed well of the pBN crucible, and boron trioxide as the liquid sealant is put into the pBN crucible above the seed. Then, polycrystalline germanium materials are loaded into the pBN growth crucible and pBN feeding container, both of which are then inserted in a quartz tube which is then sealed with a quartz cap under a reduced pressure of about $2.00\times10^{-4}$ Pascal ($1.5\times10^{-5}$ Torr). The sealed quartz tube then is seated on the quartz tube support inside the furnace.

The above-described quartz ampoule is heated at a rate of approximately 270° C./hr. When temperature reaches a value that is about 30° C. higher than the melting point of the crystallization material, the heating is maintained until all of the crystalline materials melt.

In the monocrystalline growth process, the present invention needs to fulfill the following elements:
  a) a selected amount of dopants such as silicon, boron and gallium is added into the raw material used for monocrystalline germanium growth;
  b) the dopants are added during the stage of loading raw germanium material, and then monocrystalline growth is carried out; and
  c) during the monocrystalline growth process, a suitable growth rate and temperature gradient need to be maintained so as to avoid the formation of polycrystals caused by co-doping of the dopants during the growth process.

Each of these elements, which are newly added relative to the standard monocrystalline germanium crystal growth process, is essential in order to maintain the proper solid-liquid interface shape during monocrystalline growth, and to prevent the growth of new crystal grains or polymorphic nuclei, so as to obtain an intact monocrystalline germanium ingot for preparing a monocrystalline germanium substrate for the use in multi-junction solar cells with increased open-circuit voltage. Polycrystalline growth may occur near the seed crystal, or in the tapered transition zone from the seed crystal to the equal diameter region, or in the process of equal diameter growth. The appearance of polycrystalline will result in a monocrystalline ingot which is entirely or partially useless for preparing monocrystalline germanium substrates for the use in multi-junction solar cells.

The ingot prepared by the method for preparing an ingot according to the present invention comprises silicon, boron and gallium with an atomic concentration varying in the axial direction of the ingot, wherein the ingot contains, within an effective length, silicon in an atomic concentration of from $3\times10^{14}$ atoms/cc to $10\times10^{18}$ atoms/cc, boron in an atomic concentration of from $1\times10^{16}$ atoms/cc to $10\times10^{18}$ atoms/cc, and gallium in an atomic concentration of from $1\times10^{18}$ atoms/cc to $10\times10^{19}$ atoms/cc. Preferably, silicon has an atomic concentration of from $4\times10^{14}$ atoms/cc to $8\times10^{18}$ atoms/cc, more preferably $5\times10^{14}$ atoms/cc to $7\times10^{18}$ atoms/cc. Preferably, boron has an atomic concentration of from $2\times10^{18}$ atoms/cc to $8\times10^{18}$ atoms/cc, more preferably $4\times10^{16}$ atoms/cc to $7\times10^{18}$ atoms/cc.

Preferably, gallium has an atomic concentration of from $2\times10^{16}$ atoms/cc to $9\times10^{19}$ atoms/cc, more preferably $2\times10^{16}$ atoms/cc to $8\times10^{19}$ atoms/cc.

The growth procedure is designed so as to enable a suitable growth rate from the seed crystal end to the end of the monocrystalline growth (or the entire melt solidifies and grows into a solid-state monocrystalline), and a suitable temperature gradient near the solid-liquid interface. Compared with monocrystalline ingots without dopants, the doped monocrystalline germanium ingots requires growth with a lower growth rate, and thus, the solid-liquid interface has to move at a rate 20% slower than that of monocrystalline germanium ingots without dopants, and the temperatures at different temperature zones also have to decrease at a rate lowered by about 20%.

With this growth procedure and the addition of an appropriate amount of dopant, monocrystalline growth can be maintained over the entire length of the ingot. For example, a grown monocrystalline germanium ingot can have a diameter of 4 inches and a length of about 200 mm.

After all of the raw materials in the crucible have solidified, the grown ingot is cooled to room temperature under controlled temperature conditions, with a cooling rate of about 20-40° C./h in the described example.

Co-doping effect of silicon, boron and gallium added to the raw germanium material not only lowers the resistivity of the monocrystalline germanium as mentioned above but also enables a more even resistivity distribution along the entire germanium crystal ingot from the seed crystal end to the tail end, improving the electrical properties of the monocrystalline germanium. The maximum resistivity of the germanium ingot is 1.0-3.0 times the minimum resistivity, preferably 1.2-2.5 times, more preferably 1.5-2.0 times.

For better understanding of the present invention, the present invention will hereinafter be described in detail with reference to examples, but it is to be understood that these examples are merely illustrative of the present invention and are not intended to limit the present invention.

Use

The present invention also relates to use of the monocrystalline germanium wafer according to the present invention for increasing open-circuit voltage of multi-junction solar cells.

In a preferred embodiment of the use according to the present invention, the open-circuit voltage of a multi-junction solar cell using the monocrystalline germanium wafer of the present invention is increased by 0.4-3.5% (corresponding to an increase of 10-95 mV), preferably by 1.2-3.0% (corresponding to an increase of 31-81 mV), more preferably by 1.5-2.5% (corresponding to an increase of 40-67 mV).

The present invention increases the open-circuit voltage of the solar cell device by controlling, reducing and eliminating the recombination position of photo-generated carriers.

The present invention relates to the following embodiments:

1. A monocrystalline germanium wafer, wherein the monocrystalline germanium wafer contains, as dopant elements, silicon in an atomic concentration of from $3\times10^{14}$ atoms/cc to $10\times10^{18}$ atoms/cc, boron in an atomic concentration of from $1\times10^{16}$ atoms/cc, to $10\times10^{18}$ atoms/cc and gallium in an atomic concentration of from $1\times10^{18}$ atoms/cc to $10\times10^{19}$ atoms/cc;

preferably, silicon in an atomic concentration of from $4\times10^{14}$ atoms/cc to $8\times10^{18}$ atoms/cc, boron in an atomic concentration of from $2\times10^{18}$ atoms/cc to $8\times10^{18}$ atoms/cc, and gallium in an atomic concentration of from $2\times10^{18}$ atoms/cc to $9\times10^{19}$ atoms/cc:

more preferably, silicon in an atomic concentration of from $5\times10^{14}$ atoms/cc to $7\times10^{18}$ atoms/cc, boron in an atomic concentration of from $4\times10^{16}$ atoms/cc to $7\times10^{18}$ atoms/cc and gallium in an atomic concentration of from $2\times10^{16}$ atoms/cc to $8\times10^{19}$ atoms/cc.

2. The monocrystalline germanium wafer according to embodiment 1, wherein the monocrystalline germanium wafer has a ratio of an atomic concentration of boron to that of gallium in the range of 8:1 to 1:240, preferably 5:1 to 1:170, more preferably 3:1 to 1:100.

3. The monocrystalline germanium wafer according to any one of embodiments 1 to 2, wherein the monocrystalline germanium wafer has a ratio of an atomic concentration of silicon to that of gallium in the range of 4:1-100, preferably 3:1-80, more preferably 2:1-50.

4. The monocrystalline germanium wafer according to any one of embodiments 1 to 3, wherein the monocrystalline germanium wafer has a thickness of 100-700 μm, preferably 100-500 μm, more preferably 100-200 μm, even more preferably 120-140 μm.

5. The monocrystalline germanium wafer according to any one of embodiments 1 to 4, wherein the monocrystalline germanium wafer has a sum A of the atomic concentration of silicon, boron and gallium in the range of 2 ppm≤A≤120 ppm, preferably 4 ppm≤A≤70 ppm, based on the amount of germanium.

6. The present invention also provides a method for preparing a monocrystalline germanium wafer, comprising:

1) slicing, from a monocrystalline germanium ingot containing silicon, boron and gallium, an initial monocrystalline germanium wafer, wherein the initial monocrystalline germanium wafer contains silicon in an atomic concentration of from $3\times10^{14}$ atoms/cc to $10\times10^{18}$ atoms/cc, boron in an atomic concentration of from $1\times10^{16}$ atoms/cc to $10\times10^{18}$ atoms/cc and gallium in an atomic concentration of from $1\times10^{16}$ atoms/cc to $10\times10^{19}$ atoms/cc, and has a thickness of 200-800 μm; preferably, silicon in an atomic concentration of from $4\times10^{14}$ atoms/cc to $8\times10^{18}$ atoms/cc, boron in an atomic concentration of from $2\times10^{16}$ atoms/cc to $8\times10^{18}$ atoms/cc, and gallium in an atomic concentration of from $2\times10^{16}$ atoms/cc to $9\times10^{19}$ atoms/cc; more preferably, silicon in an atomic concentration of from $5\times10^{14}$ atoms/cc to $7\times10^{18}$ atoms/cc, boron in an atomic concentration of from $4\times10^{16}$ atoms/cc to $7\times10^{18}$ atoms/cc and gallium in an atomic concentration of from $2\times10^{16}$ atoms/cc to $8\times10^{19}$ atoms/cc.

2) grinding the edges of the initial monocrystalline germanium wafer obtained in step 1);

3) subjecting the initial monocrystalline germanium wafer ground in step 2) to a surface treatment; and
4) subjecting the initial monocrystalline germanium wafer surface-treated in step 3) to rough polishing and then to finish polishing to obtain a monocrystalline germanium wafer product, wherein the resulting monocrystalline germanium wafer product has a thickness of 100-700 μm.

7. The method for preparing a monocrystalline germanium wafer according to embodiment 6, wherein the monocrystalline germanium wafer has a ratio of an atomic concentration of silicon to that of gallium in the range of 8:1 to 1:240, preferably 5:1 to 1:170, more preferably 3:1 to 1:100.

8. The method for preparing a monocrystalline germanium wafer according to any one of embodiments 6 to 7, wherein a ratio of an atomic concentration of silicon to that of gallium is 4:1-100, preferably 3:1-80, more preferably 2:1-50.

9. The method for preparing a monocrystalline germanium wafer according to any one of embodiments 6 to 8, wherein the monocrystalline germanium wafer has a thickness of 100-700 μm, preferably 100-500 μm, more preferably 100-200 μm, even more preferably 120-140 μm.

10. The method for preparing a monocrystalline germanium wafer according to any one of embodiments 6 to 9, wherein the monocrystalline germanium wafer has a sum A of the atomic concentration of silicon, boron and gallium in the range of 2 ppm≤A≤120 ppm, preferably 4 ppm≤A≤70 ppm, based on the amount of germanium 11. A method for preparing a monocrystalline germanium ingot, comprising:
1) charging a first raw germanium material, dopant elements including silicon, boron and gallium, and optionally a liquid sealer into a crucible that has been pre-loaded with a seed crystal of high-purity monocrystalline Ge in a seed well;
2) charging a second raw germanium material for supplementing the first raw germanium material into a loading container, wherein the loading container is optionally loaded with a liquid sealer;
3) placing the crucible described in step 1) and the loading container described in step 2) in a quartz tube, and sealing the quartz tube under vacuum;
4) placing the sealed quartz tube with the crucible and the loading container described in step 3) into a crystal growth furnace having a movable support that supports the quartz tube;
5) melting the first and second raw germanium materials to a first and second melt respectively, and then adding all the melted second raw germanium material contained in the loading container, into the crucible;
6) cooling the melt in the crucible obtained in step 5) with a controlled temperature gradient and a controlled cooling rate, so that the melt crystallizes when in contact with the seed crystal and forms a monocrystalline germanium ingot; and
7) cooling the monocrystalline germanium ingot;
wherein the dopants silicon, boron and gallium added in step 1) are in such amounts that the resulting monocrystalline germanium ingot contains, within the effective length, silicon in an atomic concentration of from $3\times10^{14}$ atoms/cc to $10\times10^{18}$ atoms/cc, boron in an atomic concentration of from $1\times10^{16}$ atoms/cc to $10\times10^{18}$ atoms/cc, and gallium in an atomic concentration of from $1\times10^{16}$ atoms/cc to $10\times10^{19}$ atoms/cc.
preferably, silicon in an atomic concentration of from $4\times10^{14}$ atoms/cc to $8\times10^{18}$ atoms/cc, boron in an atomic concentration of from $2\times10^{16}$ atoms/cc to $8\times10^{18}$ atoms/cc and gallium in an atomic concentration of from $2\times10^{16}$ atoms/cc to $9\times10^{19}$ atoms/cc;
more preferably, silicon in an atomic concentration of from $5\times10^{14}$ atoms/cc to $7\times10^{18}$ atoms/cc, boron in an atomic concentration of from $4\times10^{16}$ atoms/cc to $7\times10^{18}$ atoms/cc and gallium in an atomic concentration of from $2\times10^{16}$ atoms/cc to $8\times10^{19}$ atoms/cc;

12. The method for preparing a monocrystalline germanium ingot according to embodiment 11, wherein the head of the ingot has a ratio of the atomic concentration of boron to that of gallium in the range of 8-5:1, preferably 7-4:1, more preferably 5-3:1, the tail of the ingot has a ratio of the atomic concentration of boron to that of gallium in the range of 1:100-240, preferably 1:130-210, more preferably 1:160-180.

13. The method for preparing a monocrystalline germanium ingot according to any one of embodiments 11 to 12, wherein the ratio of an atomic concentration of silicon to that of gallium is 4:1-100, preferably 3:1-80, more preferably 2:1-50.

14. The method for preparing a monocrystalline germanium ingot according to any one of embodiments 11 to 13, wherein in step 6) where the melt crystallizes when in contact with the seed crystal and forms a monocrystalline germanium ingot, a temperature gradient of 0.3 to 4.0° C./cm is created in the ingot growth zone; preferably, a temperature gradient of 0.5 to 3.5° C./cm is created in the ingot growth zone; and more preferably, a temperature gradient of 1.0 to 3.0° C./cm is created in the ingot growth zone.

15. The method for preparing a monocrystalline germanium ingot according to any one of embodiments 11 to 14, wherein the monocrystalline germanium ingot has, within the effective length, a sum A of the atomic concentration of silicon, boron and gallium in the range of 2 ppm≤A≤120 ppm, preferably 4 ppm≤A≤70 ppm, based on the amount of germanium.

16. Use of the monocrystalline germanium wafer according to any of embodiments 1 to 5, a monocrystalline germanium wafer prepared by the method for preparing a monocrystalline germanium wafer according to any of embodiments 6 to 10, and a monocrystalline germanium wafer sliced from the monocrystalline germanium ingot prepared by the method for preparing a monocrystalline germanium ingot according to any of embodiments of 11 to 15 for increasing open-circuit voltage of multi-junction solar cells.

EXAMPLES

The invention is described with reference to an example. The example described herein is not intended to represent all embodiments encompassed by the invention, but rather merely to exemplify one embodiment. The present invention may include many other examples.

Raw Materials and Equipment

High purity germanium, in the shape of bricks, with a purity of 99.999%, purchased from ZhongNuo Advanced Material (Beijing) Technology Co., Ltd.; and Boron trioxide, analytically pure, purchased from Nanjing Chemical Reagent Co., Ltd.

Figure 12:
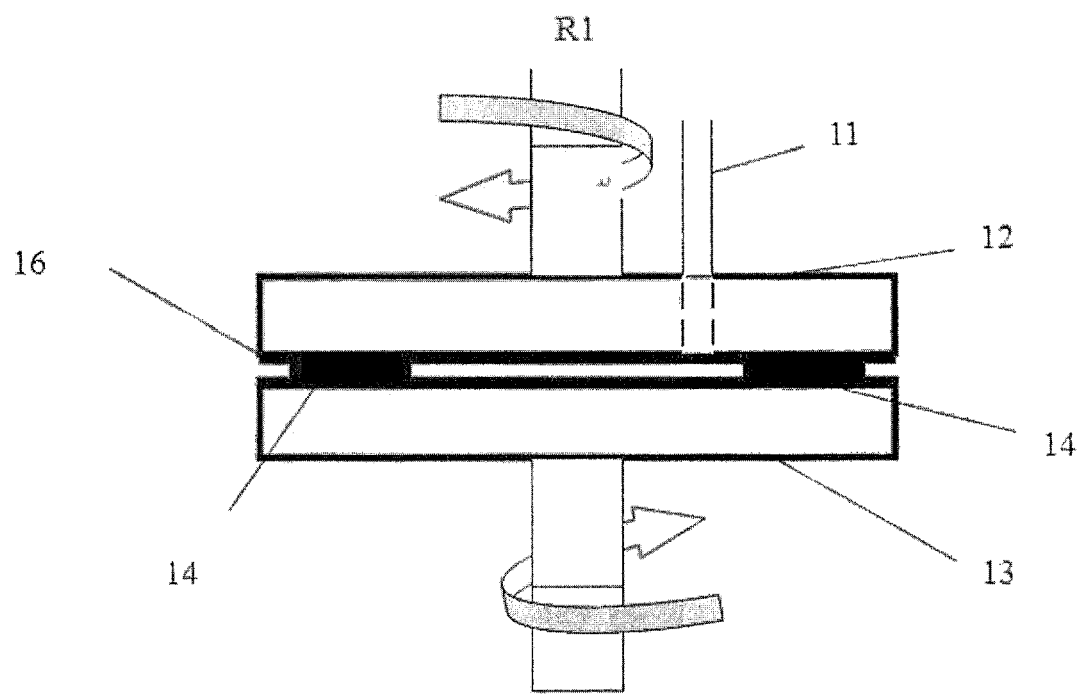
FIG. 12 is an example of an apparatus for implementing the grinding and polishing steps in the method for preparing a wafer according to the present invention.

A polishing machine (with an upper and lower disc in the diameter of 1.0 m), as shown in FIG. 12, where R1 and R2 are the rotary axis, 11 is a tube for grinding liquid or polishing liquid, 12 is an upper disc of the equipment, 13 is a lower disc of the equipment, 14 is a wafer and a support pad, and 16 is a grinding pad or a polishing pad (the grinding pad is a polyester grinding pad purchased from Universal Photonics Co. Ltd., USA, under the trade name LPS; the rough polishing pad is a polyurethane polishing pad purchased from DOW, USA, under the trade name Suba-X Pad; and the finish polishing pad is a polyurethane polishing pad purchased from DOW, USA, under the trade name POLICEX Pad; like the upper disc, the lower disc is also provided with a grinding pad and a polishing pad, both of which are located under the wafer and the support pad, and are not shown in the figure). The support pad (the same support pad being used for grinding and polishing), the grinding pad and the polishing pad have a diameter of 1 m; the support pad has 4 holes for supporting the wafer, which are located in the middle of the radical direction and are evenly distributed in the circumferential direction.

Grinding liquid is a mixture of alumina grinding powder (Fujimi 20T, available from Fujimi Corporation, Japan) and water with a weight ratio of 1:1, wherein the flow rate of the grinding liquid in the grinding process is 90 ml/m² disc areas/min (based on one side).

Multi-wire slicing machine, MWM442DM, purchased from Komatsu NTC, Japan.

Silicon carbide, with a particle size of 10 microns, purchased from ShangMo Abrasive & Grinding Tools Co., Ltd, Shanghai, China.

Mineral oil, C10 oil, purchased from AnYong Company.

Multimeter, Fluke 28-II, with a voltage range of 0.1 mV to 1,000 V, purchased from Fluke Corporation, USA.

Multifunction digital four-probe tester, ST2258A type, purchased from Suzhou JingGe Electronics Co., Ltd.

High-resolution secondary ion mass spectrometer, Nano-SIMS 50L, purchased from CAMECA Corporation, France.

Measurement of Properties

The prepared initial monocrystalline germanium wafers are measured under following conditions: a qualified wafer is defined as being intact and having no cracks on surface by visual inspection.

Resistivity is measured by the method described in the GB/T 26074-2010 "Germanium Single Crystal Resistivity Direct Current Four-Probe Measurement Method" using the above-mentioned multi-function digital four-probe tester.

Dislocation density is measured by the method described in GB/T5252-2006 "Germanium Single Crystal Dislocation Etch Pit Density Measurement Methods".

Open-circuit voltage is measured using the multimeter.

The atomic concentration of the dopants, silicon, boron and germanium, are determined using the aforementioned high-resolution secondary ion mass spectrometer under the following conditions: the average atomic concentration of Si is determined by sputtering a cesium ion (Cs+) beam as an incident ion beam on the surface of the sample until the depth of 10 micrometers inside the sample; the average atomic concentration of B is determined by sputtering an oxygen ion (O2+) beam as an incident ion beam on the surface of the sample until the depth of 10 micrometers inside the sample; the average atomic concentration of Ga is determined by sputtering an oxygen ion (O2+) beam as an incident ion beam on the surface of the sample until the depth of 10 micrometers inside the sample. The testing chamber is at $10^{-7}$ Torr vacuum, the intensity of the incident ion beam is 0.16 mA/cm², the analysis area is 250×250 square microns and the sputtering rate is 3.6 μm/h.

Preparation of Monocrystalline Germanium Ingots

In the following example, monocrystalline germanium ingots having a diameter of 4 inches with increased open-circuit voltage of a multi-junction solar cell were prepared. Nevertheless, monocrystalline germanium ingots having a diameter of, for example, 1 to 8 inches or larger can also be prepared by the method for preparing a monocrystalline germanium ingot according to the present invention.

A monocrystalline germanium ingot was prepared according to the following steps:

10 kg high-purity raw germanium material bricks and also the dopants silicon, boron, gallium in the amounts (based on the high-purity raw germanium material) described in Table 2 below and a boron trioxide liquid sealer were used.

1) loading 65% of the amounts described in Table 2 of the high-purity bulk raw germanium material, along with silicon, boron, gallium and boron trioxide respectively into a first growth crucible that has preloaded with a seed crystal of high-purity monocrystalline germanium in a seed well;

2) loading the remaining 35% of the high-purity bulk raw germanium material, along with silicon, boron, gallium and boron trioxide into a second feeding crucible located above the first growth crucible;

3) placing the first growth crucible and the second feeding crucible in a quartz tube and sealing the quartz tube under vacuum of $10^{-5}$ Torr;

4) placing the sealed quartz tube with the first growth crucible and the second feeding crucible obtained in step 3) into a crystal growth furnace having a movable support that supports said quartz tube;

5) starting the heating procedure of the growth furnace and heating the first growth crucible and the second feeding crucible at a heating rate of 20° C./min so as to melt the first raw germanium material and the second raw germanium material to a first melt and a second melt respectively, and then adding the second melt into the first melt;

6) cooling the melt obtained in step 5) with a controlled cooling rate so that the melt crystallizes when in contact with the seed crystal and forms a monocrystalline germanium ingot, wherein the temperature gradient of the monocrystalline germanium growth and the crystallization cooling rate of the monocrystalline germanium growth staring from the seed crystal end are shown in Table 2; and 7) cooling the monocrystalline germanium ingot at a cooling rate of 30° C./h after he end of monocrystalline growth.

TABLE 2

Feeding amount of each dopant and process parameters for preparing monocrystalline germanium ingot

| Example No. | Silicon, Si g (ppm*) | Boron, B g (ppm*) | Gallium, Ga g (ppm*) | Sum of dopants, g (ppm) | Temperature gradient of monocrystalline germanium growth ° C./cm | Crystallization cooling rate of monocrystalline germanium growth ° C./h |
|---|---|---|---|---|---|---|
| Invention 1 | 0.005 (0.5) | 0.0030 (0.3) | 0.03 (3) | 3.8 | 2.5 | 0.4 |
| Invention 2 | 0.05 (0.5) | 0.03 (3) | 0.6 (60) | 68 | 2.5 | 0.4 |
| Invention 3 | 0.1 (10.0) | 0.05 (5) | 0.35 (35) | 50 | 2.5 | 0.4 |
| Invention 4 | 0.15 (15.0) | 0.08 (8) | 0.35 (35) | 58 | 2.5 | 0.4 |
| Comparison 1 | 0.005 (0.5) | 0.003 (3) | 1.2 (120) | 121 | 2.5 | 0.4 |
| Comparison 2 | 0.002 (0.2) | 0.001 (0.1) | 0.02 (2) | 2.3 | 2.5 | 0.4 |

*ppm value based on high purity raw germanium materials.

Figure 3:
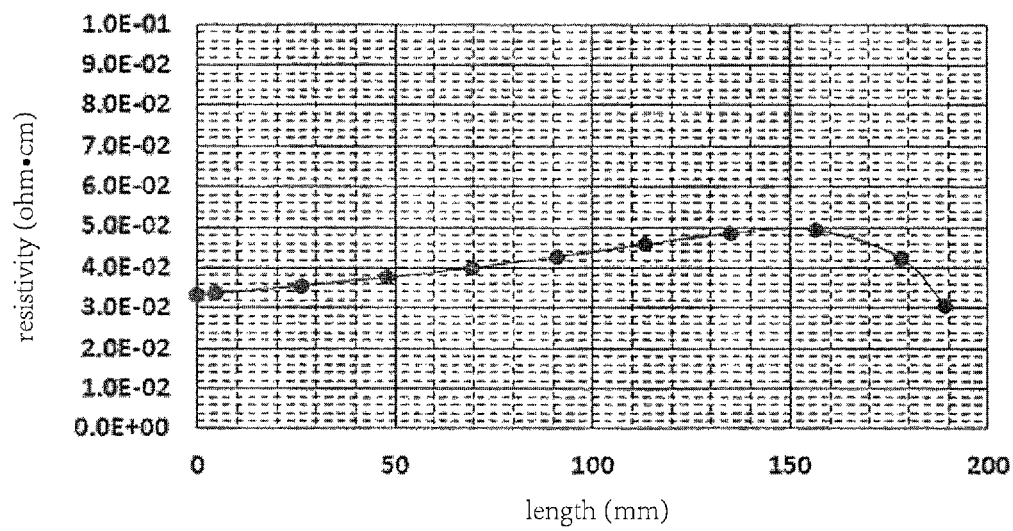
FIG. 3 is a graph showing that the head of the crystalline ingot doped with silicon, boron and gallium according to the present invention has a resistivity of 3.34E–2 Ohm·cm, and the tail of the crystalline ingot has a resistivity of 3.07E–2 Ohm·cm; the horizontal axis in the figure from the left to the right represents the length of the crystalline ingot from the head to the tail, and the vertical axis is the resistivity at the respective position; wherein the maximum resistivity in the crystalline ingot is 4.94E−2 Ohm·cm, and the value of the maximum resistivity is 1.6 times that of the minimum.
Figure 4:
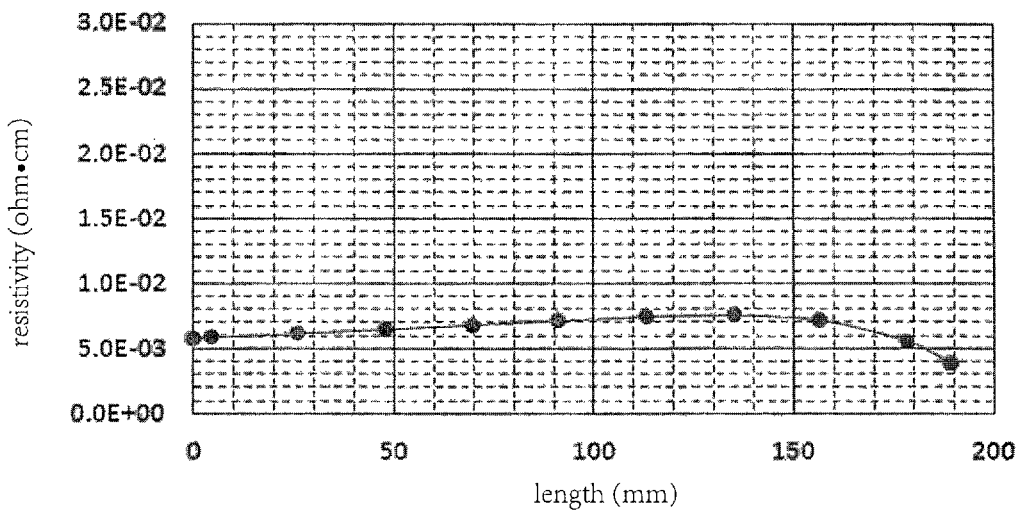
FIG. 4 is a graph showing that the head of the crystalline ingot doped with silicon, boron and gallium according to the present invention has a resistivity of 5.84E−3 Ohm·cm, and the tail of the crystalline ingot has a resistivity of 3.87E−3 Ohm·cm; the horizontal axis in the figure from the left to the right represents the length of the crystalline ingot from the head to the tail, and the vertical axis is the resistivity at the respective position; wherein the maximum resistivity in the crystalline ingot is 7.40E−3 Ohm·cm, and the value of the maximum resistivity is 1.9 times that of the minimum.
Figure 5:
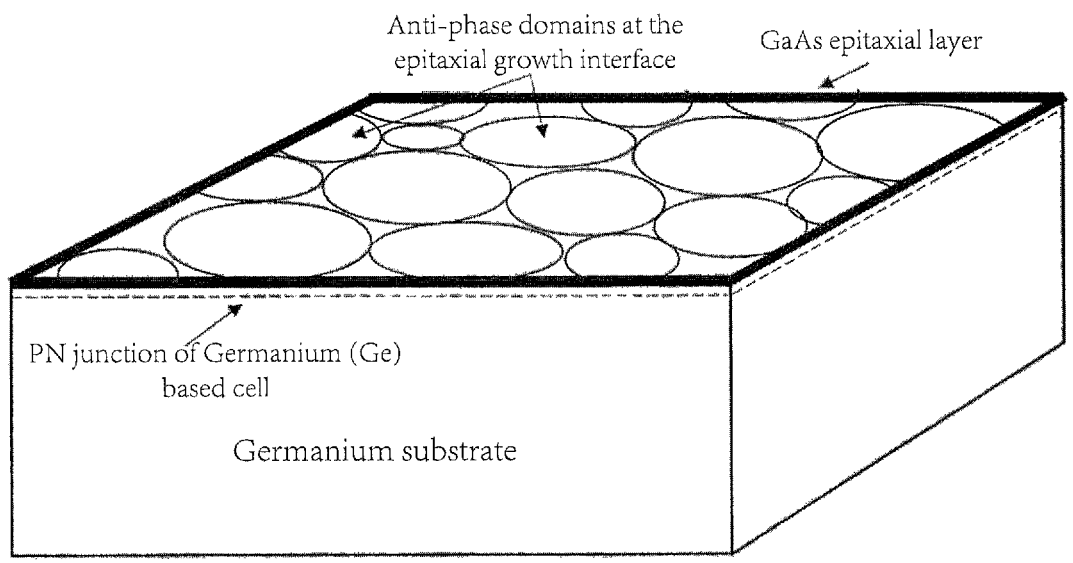
FIG. 5 is a schematic diagram of anti-phase domains formed by epitaxial growth of III-V group on monocrystalline germanium (100) substrates.

FIGS. 3 and 4 show the resistivity (Res) distribution from the beginning to the end of the gallium, boron and silicon doped monocrystalline germanium ingots of invention 1 and 2, respectively. The maximum resistivity and the minimum resistivity are obtained by plotting. Inventions 3-4 are obtained following a similar process.

The properties of the prepared monocrystalline germanium ingots are shown in Table 3.

TABLE 3

Performance test results of monocrystalline germanium ingots

| Example No. | Atomic concentration of Si in the head[1], atoms/cc | Atomic concentration of Si in the tail[2], atoms/cc | Atomic concentration of B in the head[1], atoms/cc | Atomic concentration of B in the tail[2], atoms/cc | Atomic concentration of Ga in the head[1], atoms/cc | Atomic concentration of Ga in the tail[2], atoms/cc |
|---|---|---|---|---|---|---|
| Invention 1 | $2.2 \times 10^{16}$ | $2.0 \times 10^{15}$ | $7.7 \times 10^{16}$ | $1.5 \times 10^{15}$ | $2.2 \times 10^{16}$ | $2.0 \times 10^{17}$ |
| Invention 2 | $1.2 \times 10^{17}$ | $3.2 \times 10^{15}$ | $4.3 \times 10^{16}$ | $2.2 \times 10^{17}$ | $1.1 \times 10^{17}$ | $4.1 \times 10^{17}$ |
| Invention 3 | $2.3 \times 10^{17}$ | $9.5 \times 10^{15}$ | $7.6 \times 10^{17}$ | $3.0 \times 10^{16}$ | $1.6 \times 10^{17}$ | $3.6 \times 10^{18}$ |
| Invention 4 | $3.0 \times 10^{17}$ | $1.4 \times 10^{16}$ | $9.3 \times 10^{17}$ | $1.1 \times 10^{16}$ | $1.3 \times 10^{17}$ | $2.1 \times 10^{18}$ |
| Comparison 1 | $1.0 \times 10^{15}$ | $1.0 \times 10^{15}$ | $2.0 \times 10^{15}$ | $1.0 \times 10^{15}$ | $4.6 \times 10^{17}$ | $6.4 \times 10^{18}$ |
| Comparison 2 | $1.5 \times 10^{17}$ | $7.0 \times 10^{15}$ | $5.0 \times 10^{17}$ | $2.0 \times 10^{16}$ | $3.0 \times 10^{15}$ | $4.1 \times 10^{16}$ |

| Example No. | Resistivity of the head[1] Ohm · cm | Resistivity of the tail[2] Ohm · cm | Maximal resistivity[3] Ohm · cm | Minimal resistivity[4] | Ratio of maximal resistivity to minimal resistivity |
|---|---|---|---|---|---|
| Invention 1 | 3.34E−2 | 3.07E−2 | 4.94E−2 | Tail | 1.6 |
| Invention 2 | 5.84E−3 | 3.87E−3 | 7.40E−3 | Tail | 1.9 |
| Invention 3 | 4.91E−3 | 5.19E−3 | 7.86E−3 | Head | 1.6 |
| Invention 4 | 4.21E−3 | 5.11E−3 | 7.17E−3 | Head | 1.7 |
| Comparison 1 | 1.5E−02 | 2.54E−03 | Head | Tail | 5.9 |
| Comparison 2 | 6.3E−03 | 2.98E−02 | Tail | Head | 4.7 |

[1] The sample in the ingot head is taken at a transition site between the V-shaped shoulder zone of the ingot and the zone with 4-inch equal diameter;
[2] The sample in the ingot tail is taken at a site of the growth end zone of an ingot with 4-inch equal diameter and about 200 mm length.
[3] The maximal resistivity is obtained by plotting;
[4] The minimal resistivity is obtained by plotting.

Preparation of Monocrystalline Germanium Wafers

The monocrystalline germanium ingots prepared in the above example are sliced into wafers according to the following steps.

Slicing: The monocrystalline germanium ingot is sliced into initial monocrystalline germanium wafers having a thickness of 240 μm using a multi-wire slicing machine, During slicing, a semi-enclosure graphite is used to secure the circular monocrystalline germanium ingot. After the slicing is finished, the initial monocrystalline germanium wafers are manually removed and the operation is performed by the same person under the same condition.

Chamfering: The edge of each circular wafer is chamfered using a chamfering machine such that the edge is of an arc shape in cross-section.

Fixing: The wafer at one side is placed on a circular flat ceramic plate (Ra <0.5 μm) with a diameter of 5.2 cm and a thickness of 250 μm, and is gently pressed with a pressure to ensure that there is no air bubble between the wafer and the ceramic plate.

Surface Treatment: The wafer-loaded ceramic plate is placed in an etching liquid at 35° C. for 12 seconds. The etching liquid comprises 1 mol % $NH_3$, 10 mol % hydrogen peroxide and the balance water.

Polishing: The wafer-loaded ceramic plate is then placed in the support pad chamber of a polishing machine (against the ceramic plate), and is fixed a rough polishing solution shown in Table 4 is used in the polishing machine, and the rough polishing is performed with the conditions as shown in Table 4 for 60 minutes; after washing with deionized water (with a resistivity greater than 17.5 megaohm·cm at 25° C.) and drying, the polishing machine is loaded with a finish polishing solution shown in Table 5, and the finish polishing is performed with the conditions shown in Table 5 for 6 minutes; and then the wafer-loaded ceramic wafer is taken out and placed on a heating furnace to melt the glue, and the wafer is separated from the ceramic plate, rinsed with deionized water and then dried.

Washing: a) The wafer is immersed in an aqueous solution containing 0.3% by weight of $NH_3$ and 1.3% by weight of hydrogen peroxide at 16° C. for 5 minutes (if not stated otherwise, the amount of each of the following solutions is in weight percentages based on the total weight of the solution); b) the wafer surface is rinsed with deionized water at 10° C. for 3 minutes; c) the wafer is immersed in a 10 wt % hydrogen peroxide solution at 26° C. for 5 minutes; d) the wafer surface is rinsed with deionized water at 15° C. for 3 minutes; e) the wafer is immersed in a 10% by weight aqueous ammonia solution at 20° C. for 5 minutes; f) the wafer surface is rinsed with deionized water at 15° C. for 3 minutes; and g) the wafer is dried with hot nitrogen in a rotary wafer drier.

The resulting monocrystalline germanium wafer has a thickness of 140 μm. The performance test results thereof are summarized in Table 6.

TABLE 4

Composition of rough polishing solution and polishing conditions

| Chemical composition (weight %, based on the total weight of chemical materials) | Sodium dichloroisocyanurate | 15.89 |
| --- | --- | --- |
| | Sodium pyrophosphate | 13.38 |
| | Sodium dicarbonate | 9.07 |
| | Sodium benzenesulfonate | 0.14 |
| | Silica sol | 64.06 |
| | Total concentration of chemical materials | 2.60 |
| Balance (weight %) | Water | 97.40 |
| Polishing conditions | Pressure per unit area of wafer, $g/cm^2$ | 63.75 |
| | Flow rate of polishing fluid, $l/cm^2$ wafer/h | 83.75 |
| | Rotating speed (rpm) Upper disc | 22.50 |
| | Lower disc | 11.00 |

TABLE 5

Composition of finish polishing solution and polishing conditions

| Chemical composition (weight %, based on the total weight of chemical materials) | Sodium dichloroisocyanurate | 33.95 |
| --- | --- | --- |
| | Acidic sodium pyrophosphate | 26.65 |
| | Sodium carbonate | 19.33 |
| | Sodium dicarbonate | 20.25 |

TABLE 5-continued

Composition of finish polishing solution and polishing conditions

| | Sodium benzenesulfonate | 0.36 |
| --- | --- | --- |
| | Total concentration of chemical materials | 1.23 |
| Balance (weight %) | Water | 98.77 |
| Polishing conditions | Pressure per unit area of wafer ($g/cm^2$) | 58.75 |
| | Flow rate of polishing fluid ($ml/cm^2$ wafer/min) | 0.55 |
| | Rotating speed (rpm) Upper disc | 37.50 |
| | Lower disc | 22 |

TABLE 6

Performance test results of monocrystalline germanium wafers

| Example No. | Atomic concentration of silicon, Atoms/cc | Atomic concentration of boron, Atoms/cc | Atomic concentration of gallium, Atoms/cc | Ratio of atomic concentration of boron to that of gallium | Ratio of atomic concentration of silicon to that of gallium |
| --- | --- | --- | --- | --- | --- |
| Invention 1 | 1.5 E+16 | 6.8 E+16 | 5.2 E+16 | 1.3:1 | 1:3.5 |
| Invention 2 | 6.1 E+16 | 3.5 E+16 | 1.5 E+18 | 1:43 | 1:24.6 |
| Invention 3 | 1.3 E+16 | 2.0 E+17 | 1.6 E+18 | 1:8 | 1:12.3 |
| Invention 4 | 2.9 E+17 | 9.0 E+17 | 1.4 E+17 | 6.4:1 | 2.1:1 |
| Comparison 1 | 1.2 E+15 | 1.5 E+15 | 1.1 E+18 | 1:733 | 1:916 |
| Comparison 2 | 1.3 E+17 | 4.5 E+17 | 6.0 E+15 | 75:1 | 21.7:1 |

Preparation of Solar Cells

Solar cells are prepared using the aforementioned monocrystalline germanium wafers sliced from the monocrystalline germanium ingots prepared in examples according to the following steps.

1) The obtained monocrystalline germanium substrate is placed in an epitaxial furnace, and in order to grow up an epitaxial layer of a multi-junction solar cell, a metal organic chemical vapor epitaxy process is performed, with the use of high-purity hydrogen gas, $PH_3$, $AsH_3$, TM-Ga, and TM-In as the gas source and organic metal source, and phosphorus is used as n-type dopant to form a PN junction with the germanium substrate;
2) An intermediate InGaAs cell layer is epitaxially grown;
3) A top InGaP cell layer is epitaxially grown;
4) Deposition of anti-reflection layer: The deposition of anti-reflection layer can reduce the surface reflection and to increase the refractive index. SiN is deposited using PECVD, since said deposition can not only form an anti-reflection film composed of SiN, but also generate a large number of hydrogen atoms, which can have the dual effect of both surface passivation and bulk passivation on polycrystalline silicon wafers. The deposition can be adopted for large-scale production;
5) Formation of electrodes: an electron beam evaporation process is performed to form a gold, germanium and nickel plating layer on the front and back side of the solar cell, so as to form positive and negative electrode leads;
6) Test of cells: The completed cells are classified into subcategories through tests.

The open-circuit voltage of each solar cell is measured with the multimeter.

In the examples according to the present invention, an appropriate amount of silicon dopant is added during the loading of raw germanium materials into the crucible, and a suitable growth procedure is adopted at the same time. Almost all of the raw materials loaded are grown into monocrystalline material, and almost the entire ingot can be used for the preparation of substrate materials used for epitaxy growth of solar devices. Silicon atoms are detected inside these ingots. The monocrystalline germanium substrate material prepared with these ingots allows the production of a photovoltaic device epitaxially grown thereon with significantly increased open-circuit voltage.

The results illustrate that the co-doping makes it possible to produce multi-junction solar cells, which are obtained by epitaxial growth on the substrate prepared from these crystal ingots, with a significantly increased open-circuit voltage, as summarized in Table 7 below which shows the increase in open-circuit voltage Voc, so that multi-junction solar cell devices can exhibit an increased photoelectric conversion efficiency.

TABLE 7

Increase in open circuit voltage of solar cells obtained

| Example No. | Increase in open-circuit voltage |
|---|---|
| Invention 1 | 1.6% |
| Invention 2 | 1.2% |
| Invention 3 | 2.2% |
| Invention 4 | 1.8% |
| Comparison 1 | 0.1% |
| Comparison 2 | 0.15% |

It should be noted that any germanium crystal substrate (such as crystal ingot, wafer and the like) made using the methods/processes disclosed herein is explicitly within the scope of the present invention. In addition, any product (such as an electronic device or a photoelectric device) containing such a germanium crystal substrate prepared by one of the methods of the present invention is also in accordance with the present invention.

Although in the foregoing, the present invention has been described with reference to specific embodiments thereof, it will be understood by those skilled in the art that various changes may be made to the embodiments described without departing from the spirit and scope of the invention, and the appended claims define the scope of the present inventions.

The invention claimed is:

1. A monocrystalline germanium wafer, wherein the monocrystalline germanium wafer contains, as dopant elements, silicon in an atomic concentration of from $3 \times 10^{14}$ atoms/cc to $10 \times 10^{18}$ atoms/cc, boron in an atomic concentration of from $1 \times 10^{16}$ atoms/cc to $10 \times 10^{18}$ atoms/cc, and gallium in an atomic concentration of from $1 \times 10^{16}$ atoms/cc to $10 \times 10^{19}$ atoms/cc, and wherein the monocrystalline germanium wafer has a ratio of the atomic concentration of boron to that of gallium in the range of from 8:1 to 1:240.

2. The monocrystalline germanium wafer according to claim 1, wherein the monocrystalline germanium wafer has a ratio of the atomic concentration of boron to that of gallium in the range of from 5:1 to 1:170.

3. The monocrystalline germanium wafer according to claim 2, wherein the monocrystalline germanium wafer has a ratio of the atomic concentration of boron to that of gallium in the range of from 3:1 to 1:100.

4. The monocrystalline germanium wafer according to claim 1, wherein the monocrystalline germanium wafer has a ratio of the atomic concentration of silicon to that of gallium in the range of 4:1-100.

5. The monocrystalline germanium wafer according to claim 4, wherein the monocrystalline germanium wafer has a ratio of the atomic concentration of silicon to that of gallium in the range of 3:1-80.

6. The monocrystalline germanium wafer according to claim 5, wherein the monocrystalline germanium wafer has a ratio of the atomic concentration of silicon to that of gallium in the range of 2:1-50.

7. The monocrystalline germanium wafer according to claim 1, wherein the monocrystalline germanium wafer has a thickness of 100-700 μm.

8. The monocrystalline germanium wafer according to claim 7, wherein the monocrystalline germanium wafer has a thickness of 100-500 μm.

9. The monocrystalline germanium wafer according to claim 8, wherein the monocrystalline germanium wafer has a thickness of 100-200 μm.

10. The monocrystalline germanium wafer according to claim 9, wherein the monocrystalline germanium wafer has a thickness of 120-140 μm.

11. The monocrystalline germanium wafer according to claim 1, wherein the monocrystalline germanium wafer has a sum A of the atomic concentrations of silicon, boron and gallium in the range of 2 ppm≤A≤120 ppm.

12. The monocrystalline germanium wafer according to claim 11, wherein the monocrystalline germanium wafer has a sum A of the atomic concentrations of silicon, boron and gallium in the range of 4 ppm≤A≤70 ppm, based on the amount of germanium.

13. The monocrystalline germanium wafer according to claim 1, wherein the monocrystalline germanium wafer contains, as dopant elements, silicon in an atomic concentration of from $4 \times 10^{14}$ atoms/cc to $8 \times 10^{18}$ atoms/cc, boron in an atomic concentration of from $2 \times 10^{16}$ atoms/cc to $8 \times 10^{18}$ atoms/cc, and gallium in an atomic concentration of from $2 \times 10^{16}$ atoms/cc to $9 \times 10^{19}$ atoms/cc.

14. The monocrystalline germanium wafer according to claim 13, wherein the monocrystalline germanium wafer contains, as dopant elements, silicon in an atomic concentration of from $5 \times 10^{14}$ atoms/cc to $7 \times 10^{18}$ atoms/cc, boron in an atomic concentration of from $4 \times 10^{16}$ atoms/cc to $7 \times 10^{18}$ atoms/cc, and gallium in an atomic concentration of from $2 \times 10^{16}$ atoms/cc to $8 \times 10^{19}$ atoms/cc.

15. A method for preparing a monocrystalline germanium wafer, comprising:
1) Slicing, from a monocrystalline germanium ingot containing silicon, boron and gallium, an initial monocrystalline germanium wafer, wherein the initial germanium monocrystalline wafer contains silicon in an atomic concentration of from $3 \times 10^{14}$ atoms/cc to $10 \times 10^{18}$ atoms/cc, boron in an atomic concentration of from $1 \times 10^{16}$ atoms/cc to $10 \times 10^{18}$ atoms/cc, and gallium in an atomic concentration of from $1 \times 10^{16}$ atoms/cc to $10 \times 10^{19}$ atoms/cc, and wherein the monocrystalline germanium wafer has a ratio of the atomic concentration of boron to that of gallium in the range of from 8:1 to 1:240
2) grinding the edges of the initial monocrystalline germanium wafer obtained in step 1);
3) subjecting the initial monocrystalline germanium wafer ground in step 2) to a surface treatment; and
4) Subjecting the initial monocrystalline germanium wafer surface-treated in step 3) to rough polishing and then to finish polishing to obtain a monocrystalline germanium wafer product.

16. The method for preparing a monocrystalline germanium wafer according to claim 15, wherein the monocrystalline germanium wafer has a ratio of the atomic concentration of boron to that of gallium in the range of 5:1 to 1:170.

17. The method for preparing a monocrystalline germanium wafer according to claim 15, wherein the ratio of the atomic concentration of silicon to that of gallium is in the range of 4:1-100.

18. The method for preparing a monocrystalline germanium wafer according to claim 15, wherein the monocrystalline germanium wafer has a thickness of 100-700 μm.

19. The method for preparing a monocrystalline germanium wafer according to claim 15, wherein the monocrystalline germanium wafer has a sum A of the atomic concentrations of silicon, boron and gallium in the range of 2 ppm≤A≤120 ppm.

20. A method for preparing a monocrystalline germanium ingot, comprising:
   1) Charging a first raw germanium material, dopant elements including silicon, boron and gallium, into a crucible that has been pre-loaded with a seed crystal of high-purity monocrystalline Ge in a seed well;
   2) Charging a second raw germanium material for supplementing the first raw germanium material into a loading container;
   3) Placing the crucible described in step 1) and the loading container described in step 2) in a quartz tube, and sealing the quartz tube under vacuum;
   4) Placing the sealed quartz tube with the crucible and the loading container described in step 3) into a crystal growth furnace having a movable support that supports the quartz tube;
   5) Melting the first and second raw germanium materials to a first and second melt respectively, and then adding all the melted second raw germanium material contained in the loading container, into the crucible;
   6) Cooling the melt in the crucible obtained in step 5) with a controlled temperature gradient and a controlled cooling rate, so that the melt crystallizes when in contact with the seed crystal and forms a monocrystalline germanium ingot; and
   7) Cooling the monocrystalline germanium ingot;
   wherein the silicon, boron and gallium added as dopant elements in step 1) are in such amounts that the resulting monocrystalline germanium ingot contains, within an effective length, silicon in an atomic concentration of from $3\times10^{14}$ atoms/cc to $10\times10^{18}$ atoms/cc, boron in an atomic concentration of from $1\times10^{16}$ atoms/cc to $10\times10^{18}$ atoms/cc, and gallium in an atomic concentration of from $1\times10^{16}$ atoms/cc to $10\times10^{19}$ atoms/cc, and wherein the monocrystalline germanium wafer has a ratio of the atomic concentration of boron to that of gallium in the range of from 8:1 to 1:240.

* * * * *